US008134862B1

(12) United States Patent
Ikeda et al.

(10) Patent No.: US 8,134,862 B1
(45) Date of Patent: Mar. 13, 2012

(54) SEMICONDUCTOR MEMORY DEVICE AND SEMICONDUCTOR DEVICE

(75) Inventors: Takayuki Ikeda, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1119 days.

(21) Appl. No.: 11/958,744

(22) Filed: Dec. 18, 2007

(30) Foreign Application Priority Data

Dec. 26, 2006 (JP) .................. 2006-349377

(51) Int. Cl.
 *G11C 11/34* (2006.01)
(52) U.S. Cl. ........................ 365/156; 365/226
(58) Field of Classification Search .................. 365/156, 365/226
 See application file for complete search history.

(56) References Cited

U.S. PATENT DOCUMENTS

| | | | |
|---|---|---|---|
| 7,196,709 B2 | 3/2007 | Kurokawa et al. | |
| 7,257,017 B2* | 8/2007 | Liaw ........................... | 365/154 |
| 7,907,952 B2* | 3/2011 | Lee et al. .................... | 455/452.2 |
| 2003/0098875 A1 | 5/2003 | Kurokawa et al. | |
| 2007/0229228 A1 | 10/2007 | Yamazaki et al. | |
| 2007/0229279 A1 | 10/2007 | Yamazaki et al. | |
| 2007/0229281 A1 | 10/2007 | Shionoiri et al. | |

FOREIGN PATENT DOCUMENTS

JP 09-186252 7/1997

OTHER PUBLICATIONS

K. Finkenzeller; "SOFEL Research and Development, RFID Handbook Second Edition, Principles and Applications on Non-contact IC Cards" (The Nikkan Kogyo Shimbun, Ltd.); pp.243-271.
Yasunobu Nakase et al.; "A Macro Analysis of Soft Errors in Static RAM's"; *IEEE Journal of Solid-State Circuits*, vol. 23, No. 2; pp. 604-605; Apr. 1988.
Katsuro Sasaki et al.; "A 9-ns 1-Mbit CMOS SRAM"; *IEEE Journal of Solid-State Circuits*, vol. 24, No. 5; pp. 1219-1225; Oct. 1989.
Masato Matsumiya et al.; "A 15-ns 16-Mb CMOS SRAM with Interdigitated Bit-Line Architecture"; *IEEE Journal of Solid-State Circuits*, vol. 27, No. 11; pp. 1497-1503; Nov. 11, 1992.

* cited by examiner

*Primary Examiner* — Michael Tran
(74) *Attorney, Agent, or Firm* — Fish & Richardson P.C.

(57) ABSTRACT

An object is to provide a semiconductor memory device which holds data of an SRAM or a flip-flop circuit and holds data in the SRAM while electric power is not supplied from a reader or electric power is not enough, without changing a battery for driving a power supply corresponding to deterioration of the battery with time, and a semiconductor device provided with the semiconductor memory device. An SRAM cell, a decoder connected to the SRAM cell through a word line, a read/write circuit connected to the SRAM cell through the data line, and a power storage unit connected to the SRAM cell are provided. The power storage unit is charged when data is written to or read from the SRAM cell through the data line.

14 Claims, 14 Drawing Sheets

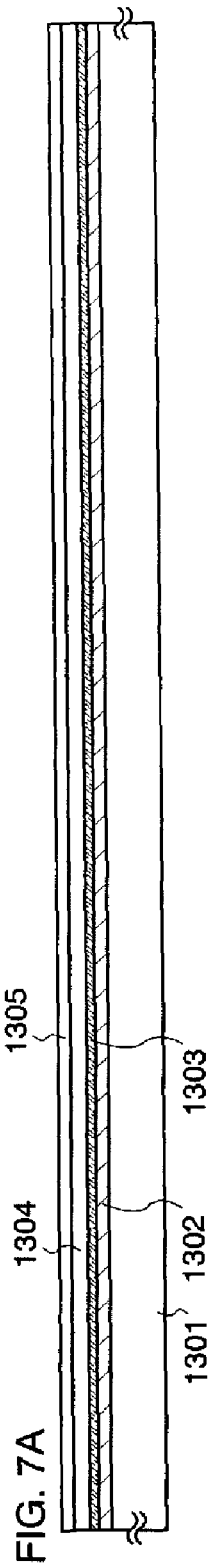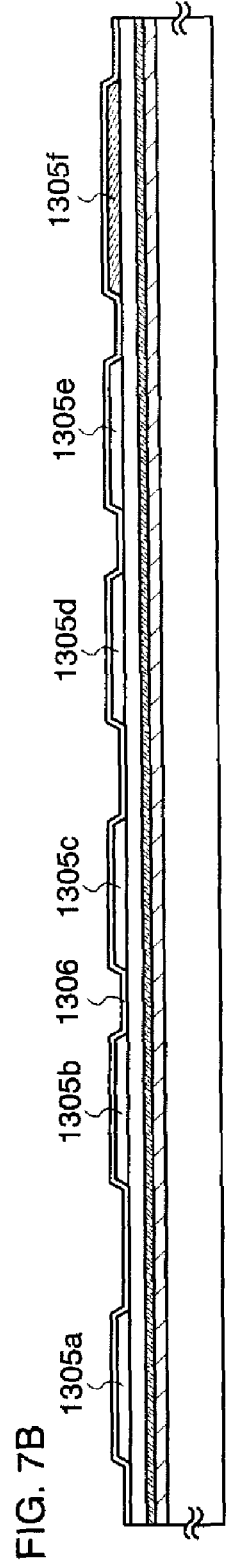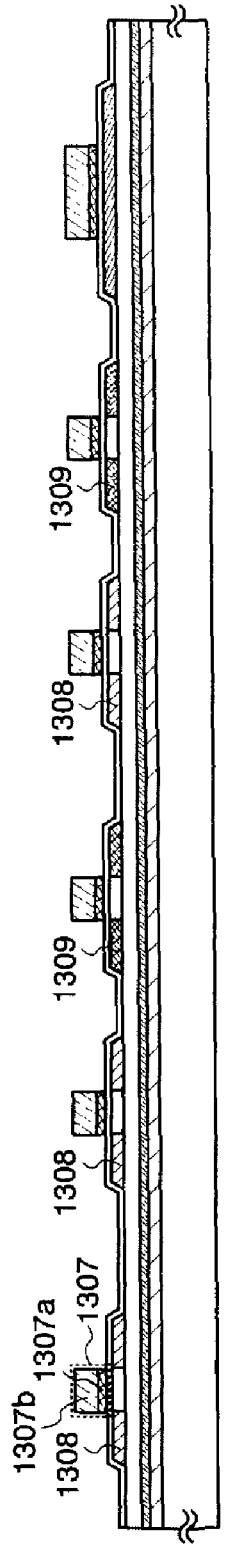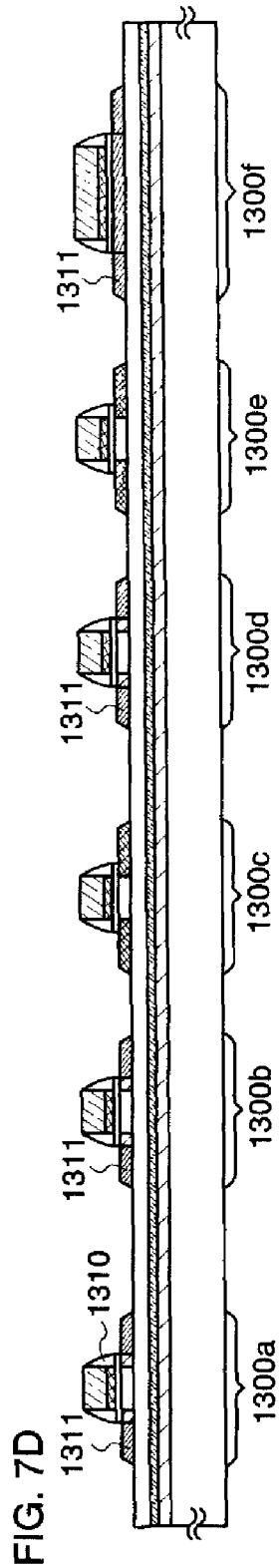

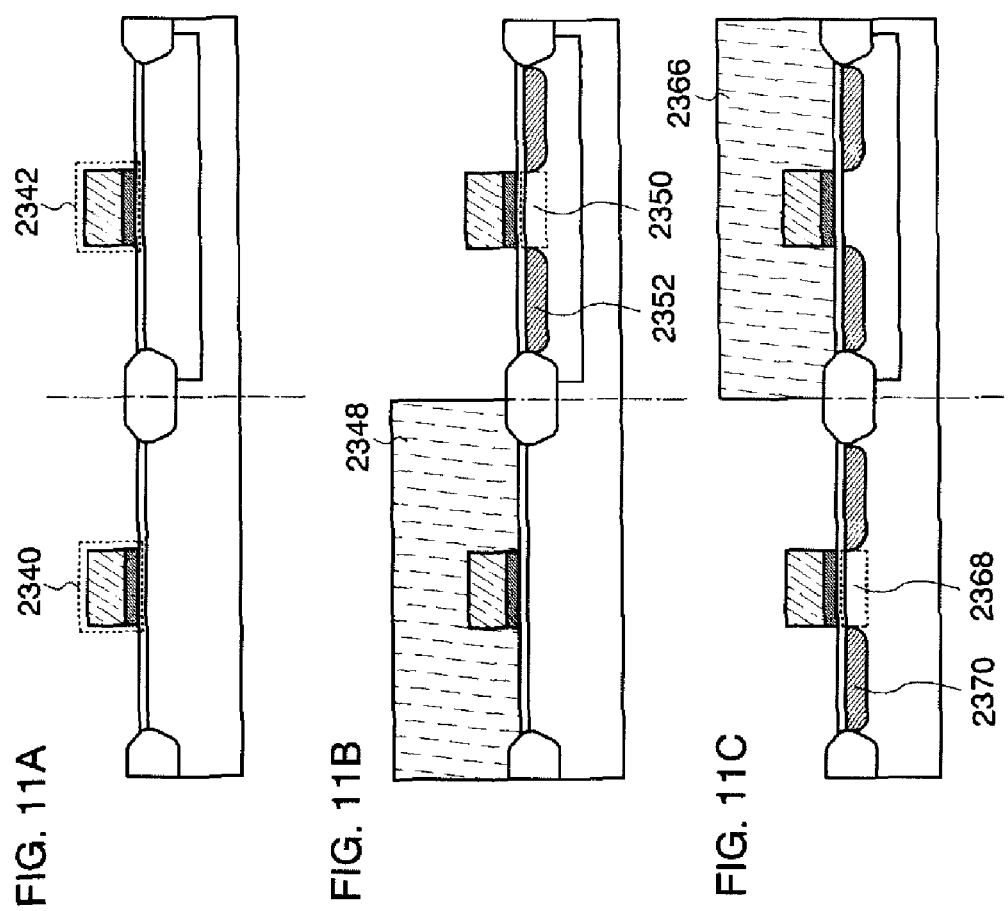

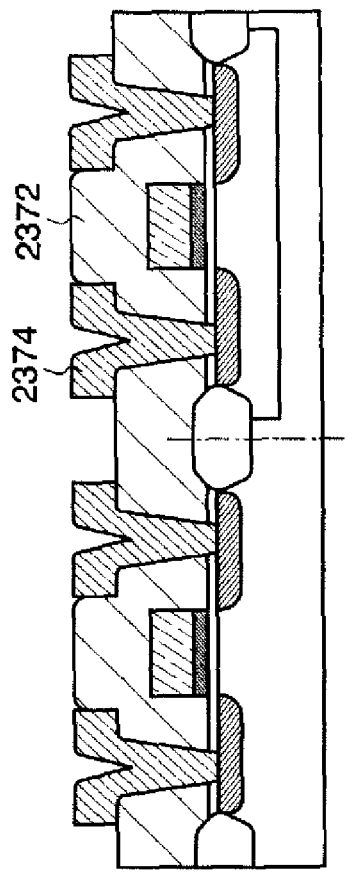
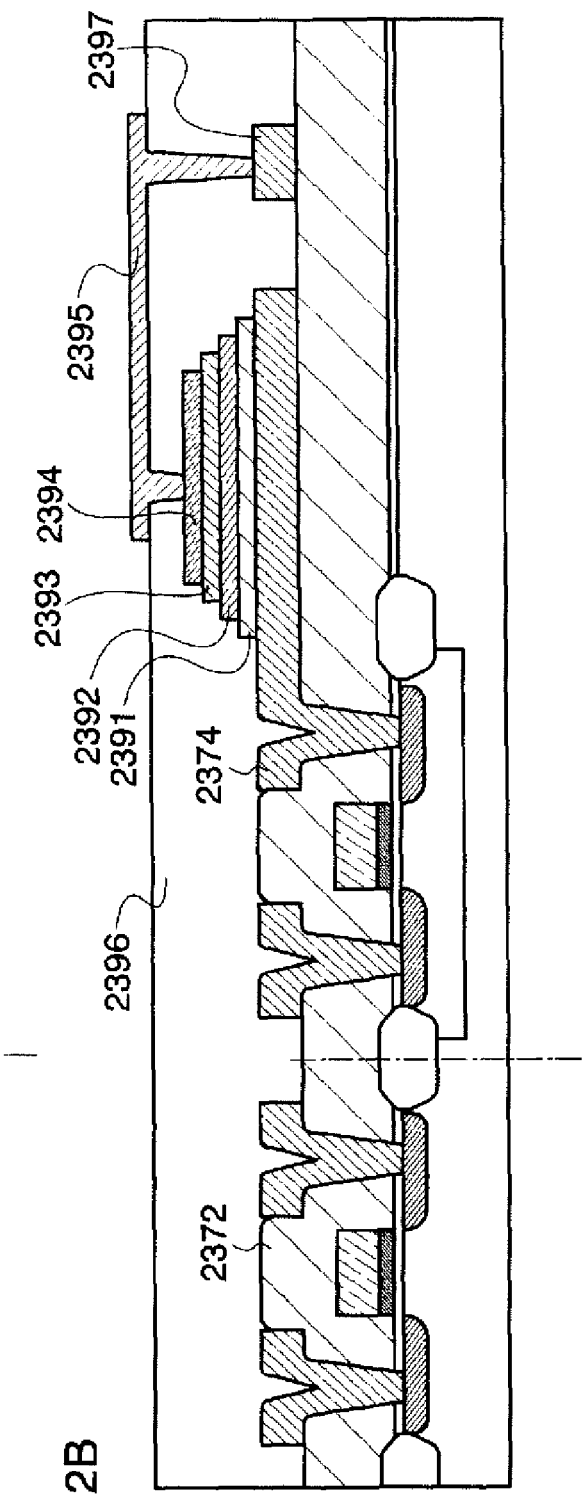
FIG. 12A
FIG. 12B

SEMICONDUCTOR MEMORY DEVICE AND SEMICONDUCTOR DEVICE

CROSS-REFERENCE TO RELATED APPLICATION

This application claims the benefit of foreign priority under 35 U.S.C. §119 to Japanese Patent Application Serial No. 2006-349377, filed with the Japan Patent Office on Dec. 26, 2006, the entire contents of which are hereby incorporated by reference.

BACKGROUND OF THE INVENTION

1. Field of the Invention

The present invention relates to a semiconductor memory device and a semiconductor device which is provided with the semiconductor memory device and performs non-contact communication.

2. Description of the Related Art

In recent years, an individual identification technique with the utilization of wireless communication using an electromagnetic field, a radio wave, or the like has attracted attention. In particular, an individual identification technique with the utilization of an RFID (radio frequency identification) tag as a semiconductor device which performs data communication by wireless communication has attracted attention. An REID tag (hereinafter, simply referred to as RFID) is also referred to as an IC (integrated circuit) tag, an RF tag, a wireless tag, an electronic tag, an IC chip, a wireless chip, a transponder, or a data carrier. An individual identification technique with the utilization of RFID has been useful for production, management, and the like of an individual object, and has been expected to be applied to personal authentication.

A memory is used in RFID in order to store data, ID, or a communication state. In addition, in a case where a CPU is mounted on RFID, a memory is mounted on the RFID in order to store a program or a processing variable. As a memory, a ROM (read only memory), an EEPROM (electrically erasable programmable read only memory), or an SRAM (static random access memory) is used (e.g., Non-Patent Document 1: Klaus Finkenzeller, trans. SOFEL Research and Development, *RFID Handbook Second Edition, Principles and Applications of Non-contact IC Cards*, (The Nikkan Kogyo Shimbun, Ltd.), pp. 243-271).

A control circuit included in RFID generally includes a sequential circuit, and a flip-flop circuit included in the sequential circuit has the same structure as an SRAM.

RFID can be classified into two types depending on whether a power supply is incorporated in the RFID or power supply voltage is supplied from a reader (also referred to as a reader/writer or a transmitter): an active-type RFID capable of transmitting electromagnetic waves including information, and a passive-type RFID which is driven with the utilization of electric power of radio waves or electromagnetic waves (carrier waves) from the reader. Of these, the active-type RFID has a structure in which a power supply for driving the RFID is incorporated and a battery is provided as the power supply. In addition, the passive-type RFID has a structure in which power supply voltage for driving the RFID is generated with the utilization of electric power of electromagnetic waves (carrier waves) from the reader, so that a structure without a battery is realized.

In a case where an SRAM is mounted on RFID as a memory, an active-type RFID mounted with a power supply is needed in order to store data in an SRAM while electric power is not supplied from a reader. However, in a case of the active-type RFID, there has been a problem in that a battery has been exhausted with time corresponding to transmittance and reception of individual information and setting of intensity of radio waves needed for transmittance and reception, and electric power needed for transmittance and reception of individual information has not been able to be generated eventually. Therefore, there has been a problem in that check of remaining capacity and change of a battery have been needed in order to keep using a semiconductor device including an active-type RFID provided with a battery for driving. In addition, in a case where RFID is mounted with a battery for driving, reduction in size of the RFID could become difficult or usage of the RFID could be restricted depending on resistance-to-temperature characteristics of the battery.

SUMMARY OF THE INVENTION

In view of the foregoing problems, it is an object of the present invention to provide a semiconductor memory device which stores data of an SRAM or a flip-flop circuit and stores data in an SRAM while electric power is not supplied from a reader or electric power is not enough, without changing a battery for driving a power supply corresponding to deterioration of the battery with time, and a semiconductor device provided with the semiconductor memory device.

The semiconductor memory device of the present invention includes an SRAM cell, a decoder connected to the SRAM cell through a word line, a read/write circuit connected to the SRAM cell through a first data line and a second data line, and a power storage unit connected to the SRAM cell, where the power storage unit stores up electric power supplied from the first data line or the second data line through the SRAM cell. The power storage unit is charged when data is written in or read from the SRAM cell. In this specification, the SRAM cell means an SRAM type memory cell.

Moreover, in the semiconductor memory device of the present invention, in the above-described structure, pluralities of SRAM cells and power storage units are provided, and the power storage unit is provided for each of the plurality of SRAM cells.

The semiconductor device of the present invention includes an antenna circuit, a decoder and a read/write circuit driven by electric power supplied through the antenna circuit, an SRAM cell connected to the decoder through a word line and connected to the read/write circuit through a first data line and a second data line, and a power storage unit connected to the SRAM cell, where the power storage unit stores up electric power supplied from the first data line or the second data line through the SRAM cell.

In addition, the semiconductor device of the present invention includes an antenna circuit, a power supply portion which rectifies electric power supplied through the antenna circuit and outputs the rectified electric power, a decoder and a read/write circuit driven by electric power supplied through the antenna circuit, an SRAM cell connected to the decoder through a word line and connected to the read/write circuit through a first data line and a second data line, and a power storage unit connected to the SRAM cell, where the power storage unit stores up electric power supplied from the power supply portion or electric power supplied from the first data line or the second data line through the SRAM cell.

Moreover, in the semiconductor device of the present invention, in the above-described structure, the power storage unit is charged when data is written to or read from the SRAM cell.

Furthermore, the semiconductor device of the present invention, in the above-described structure, the SRAM cell operates even in a case where electric power supplied from the outside through the antenna circuit is not supplied to the decoder and the read/write circuit.

In the present invention, there is no particular limitation on a transistor included in the SRAM cell. A thin film transistor (TFT) using a non-single crystal semiconductor film, typified by amorphous silicon or polycrystalline silicon; a transistor which is formed using a semiconductor substrate or an SOI substrate; a MOS transistor; or the like can be applied, and an element which can employ a CMOS structure is preferable in order to prolong data holding time. In addition, there is no particular limitation on the kind of substrate over which a transistor is formed. For example, a single crystal substrate, an SOI substrate, a glass substrate, a plastic substrate, or the like can be used.

In this specification, the SRAM includes a flip-flop circuit.

The use of the present invention makes it possible to provide a semiconductor memory device which holds data in an SRAM cell even in a case where electric power is not supplied from a reader or a case where electric power is not enough. In addition, although data cannot be rewritten because data is stored in a case of using ROM, data can be rewritten and stored when the semiconductor memory device of the present invention is used.

BRIEF DESCRIPTION OF THE DRAWINGS

In the accompanying drawings:

FIGS. 7A to 7D are views showing an example of a manufacturing method of a semiconductor device of the present invention;

FIGS. 11A to 11C are views showing an example of a manufacturing method of a semiconductor device of the present invention;

FIGS. 12A and 12B are views showing an example of a manufacturing method of a semiconductor device of the present invention;

DETAILED DESCRIPTION OF THE INVENTION

Embodiment Mode

Figure 1:
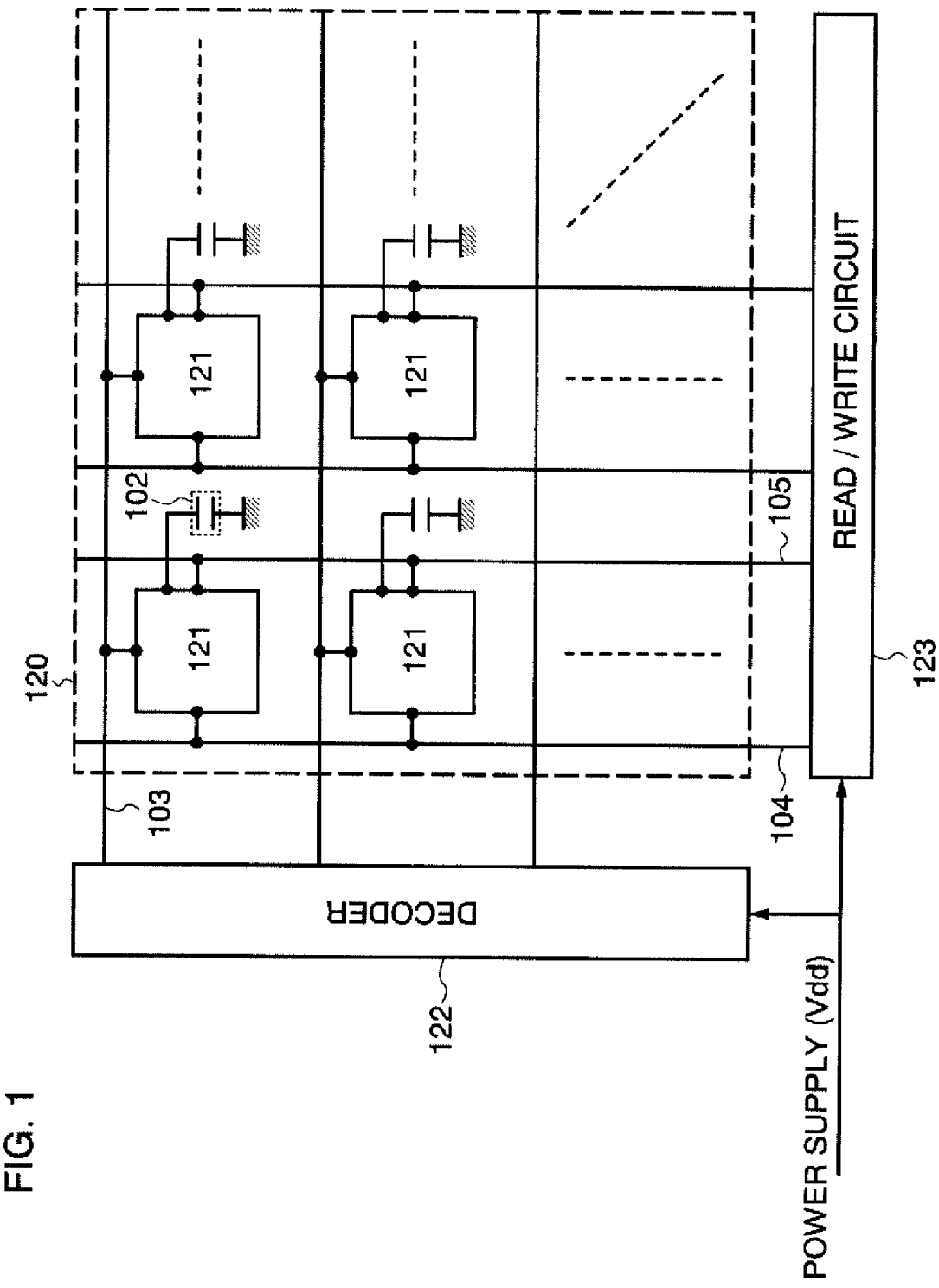
FIG. 1 is a diagram showing an example of a semiconductor memory device of the present invention.

Embodiment Modes of the present invention will be hereinafter described in detail with reference to the accompanying drawings. However, the present invention can be carried out in many different modes and it is easily understood by those skilled in the art that modes and details of the present invention can be modified in various ways without departing from the purpose and scope of the present invention. Therefore, the present invention is not understood as being limited to the following description of Embodiment Modes. Note that in all drawings for explaining Embodiment Modes, the same portions or portions having similar functions are denoted by the same reference numerals, and repeated explanation thereof will be omitted.

Embodiment Mode 1

In this embodiment mode, an example of a semiconductor memory device of the present invention will be described.

The semiconductor memory device described in this embodiment mode includes an SRAM provided with a power storage unit as a memory for storing data. The SRAM is provided with the power storage unit, so that data can be stored and held even in a case where electric power is not supplied from the outside (i.e., the case where a power supply is turned off). Structure and operation of the semiconductor memory device are described with reference to drawings.

The semiconductor memory device described in this embodiment mode includes a decoder 122, a read/write circuit 123, and a memory cell array 120 provided with a plurality of SRAM cells 121 (see FIG. 1).

The decoder 122 is connected to each of the SRAM cells 121 through a word line 103, and selects the SRAM cell 121. The read/write circuit 123 is connected to each of the SRAM cells 121 through a first data line 104 and a second data line 105, and writes or reads data into or from the SRAM cell 121.

The SRAM cell 121 is connected to the word line 103, the first data line 104, the second data line 105, and a power storage unit 102. The power storage unit 102 has functions of giving and receiving electric power to and from the SRAM cell 121. In other words, there are a case where the power storage unit 102 supplies electric power to the SRAM cell 121 and a case where the power storage unit 102 is supplied with electric power from the first data line 104 and the second data line 105 through the SRAM cell 121.

The SRAM cell 121 is an SRAM type memory cell. The SRAM cell 121 may have any structure as long as it can write and rewrite information to a memory cell and read the information from the memory cell and the structure does not need memory holding (refresh) operation. Hereinafter, with reference to FIG. 2, specific structure and operation of the SRAM cell 121 are described using a CMOS SRAM cell as an example. Needless to say, the SRAM cell is not limited to six-transistor type. The SRAM cell may be a highly-resistive load type (four-transistor type).

Figure 2:
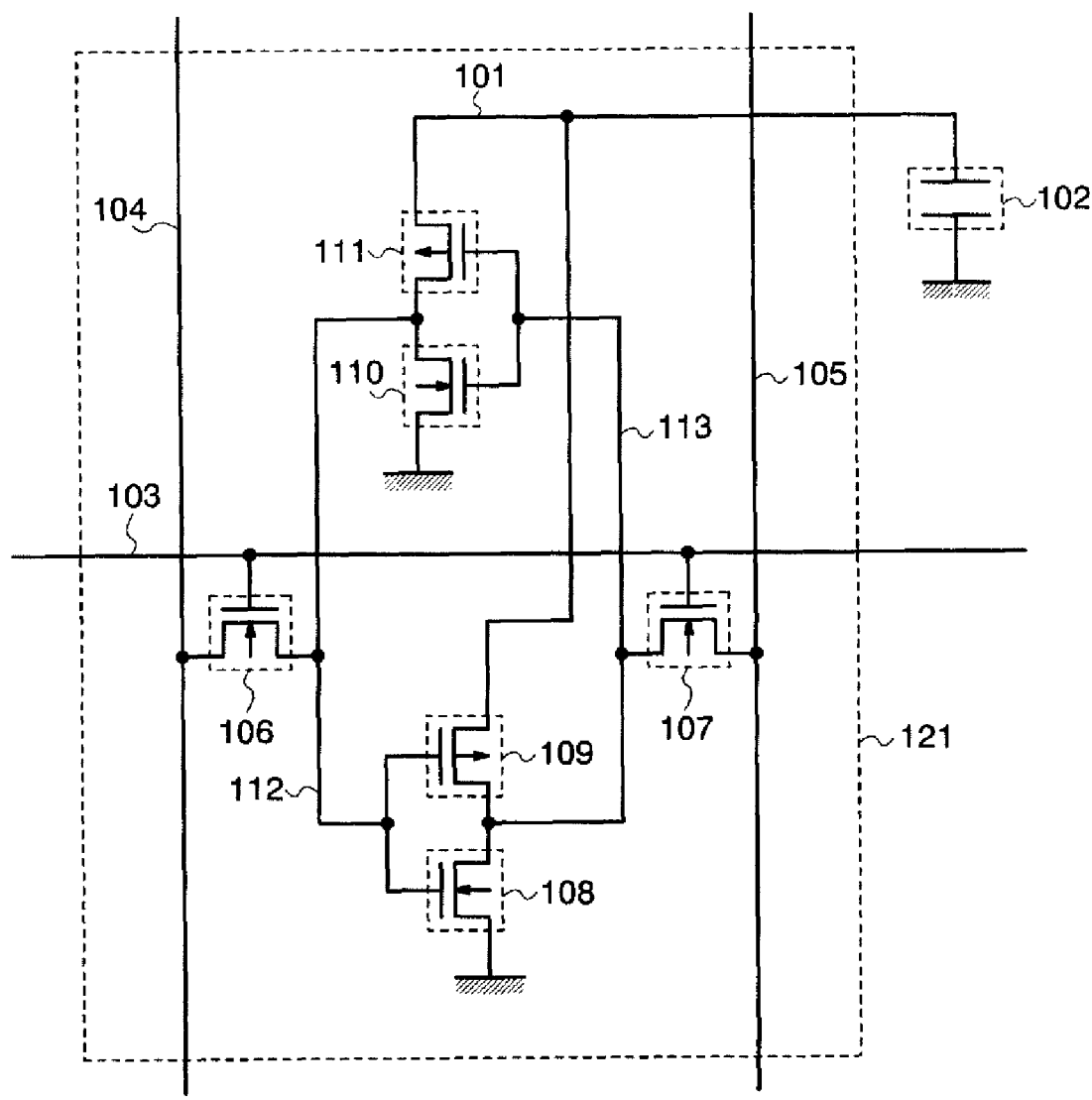
FIG. 2 is a diagram showing an example of an SRAM cell of a semiconductor memory device of the present invention.

In FIG. 2, the SRAM cell 121 includes first to sixth transistors 106 to 111. The first transistor 106 and the second transistor 107 each function as a selecting transistor. One of the third transistor 108 and the fourth transistor 109 (here, the third transistor 108) is an n-channel transistor and the other (here, the fourth transistor 109) is a p-channel transistor to be complementary combined for forming a CMOS. In a similar manner, one of the fifth transistor 110 and the sixth transistor 111 (here, the fifth transistor 110) is an n-channel transistor and the other (here, the sixth transistor 111) is a p-channel transistor to be complementary combined for forming a CMOS.

A gate electrode of the first transistor 106 is connected to the word line 103; one of a source electrode and a drain electrode is connected to the first data line 104; and the other is connected to a gate electrode of the third transistor 108, a gate electrode of the fourth transistor 109, a drain electrode of the fifth transistor 110, and one of a source electrode and a drain electrode of the sixth transistor 111. Note that, here, an example in which the first transistor 106 is provided as an n-channel transistor is shown.

A gate electrode of the second transistor 107 is connected to the word line 103; one of a source electrode and a drain electrode is connected to the second data line 105; and the other is connected to a drain electrode of the third transistor 108, one of a source electrode and a drain electrode of the fourth transistor 109, a gate electrode of the fifth transistor 110, and a gate electrode of the sixth transistor 111. Note that, here, an example in which the second transistor 107 is provided as an n-channel transistor is shown.

The third transistor 108 is an n-channel transistor. The gate electrode of the third transistor 108 is connected to the gate electrode of the fourth transistor 109, a source electrode thereof is connected to a ground, and the drain electrode thereof is connected to the one of the source electrode and the train electrode of the fourth transistor 109. In addition, the fourth transistor 109 is a p-channel transistor. The other of the source electrode and the drain electrode of the fourth transistor 109 is connected to the power storage unit 102 and the other of the source electrode and the drain electrode of the sixth transistor 111.

The fifth transistor 110 is an n-channel transistor. The gate electrode of the fifth transistor 110 is connected to the gate electrode of the sixth transistor 111, the source electrode thereof is connected to a ground, and the drain electrode thereof is connected to the one of the source electrode and the drain electrode of the sixth transistor 111. In addition, the sixth transistor 111 is a p-channel transistor. The other of the source electrode and the drain electrode of the sixth transistor 111 is connected to the power storage unit 102.

The power storage unit 102 may have a structure capable of storing up and supplying electric power, and a capacitor or a small secondary battery can be used. As a capacitor, it is preferable to use an electrode material having a large specific surface area, such as activated carbon, fullerene, or a carbon nanotube. A capacitor has a simpler structure than a battery, and thus, the capacitor can be easily thinned and stacked.

Next, operation of the SRAM cell 121 shown in FIG. 2 is described. Note that, here, a portion where the other of the source electrode and the drain electrode of the fourth transistor 109, the other of the source electrode and the drain electrode of the sixth transistor 111, and the power storage unit 102 are connected is a node 101. In addition, a portion where the other of the source electrode and the drain electrode of the first transistor 106, the gate electrode of the third transistor 108, the gate electrode of the fourth transistor 109, the drain electrode of the fifth transistor 110, and the one of the source electrode and the drain electrode of the sixth transistor 111 are connected is a node 112. Moreover, a portion where the one of the source electrode and the drain electrode of the second transistor 107, the drain electrode of the third transistor 108, the one of the source electrode and the drain electrode of the fourth transistor 109, the gate electrode of the fifth transistor 110, and the gate electrode of the sixth transistor 111 are connected is a node 113.

First, a case where data is written to the SRAM cell 121 is described.

When data is written to the SRAM cell 121, power supply voltage (Vdd) is supplied to the decoder 122 and the read/write circuit 123. For example, in a case where a signal including data (e.g., "1") to be written is outputted from the read/write circuit 123, that is, in a case where a potential of the first data line 104 is set to High and a potential of the second data line 105 is set to Low, when the word line 103 is set to High, the first transistor 106 and the second transistor 107 are turned on, and a potential of the node 112 becomes High and a potential of the node 113 becomes Low. At this time, in a case where a potential of the node 101 is lower than that of the node 112, the sixth transistor 111 in which the source electrode is the node 112 and the gate electrode is the node 113 is turned on and the potential of the node 101 becomes High. That is, the power storage unit 102 is charged.

In addition, in a case where a signal including data (e.g., "0") to be written is outputted from the read/write circuit 123, that is, the potential of the first data line 104 is set to Low and the potential of the second data line 105 is set to High, when the word line 103 is set to High, the first transistor 106 and the second transistor 107 are turned on, and the potential of the node 112 becomes Low and the potential of the node 113 becomes High. At this time, in a case where the potential of the node 101 is lower than that of the node 113, the fourth transistor 109 in which the source electrode is the node 113 and the gate electrode is the node 112 is turned on and the potential of the node 101 becomes High. That is, the power storage unit 102 is charged.

Next, a case where data is read from the SRAM cell 121 is described.

Power supply voltage is supplied to the decoder 122 and the read/write circuit 123 also when data is read from the SRAM cell 121. Before the potential of the word line 103 becomes High, the potentials of the first data line 104 and the second data line 105 are set to a precharge potential. The precharge potential is set to about half of a power supply potential of the decoder 122 and the read/write circuit 123. When the potential of the word line 103 becomes High, the first transistor 106 and the second transistor 107 are turned on.

For example, in a case where the potential of the node 101 is higher than the precharge potential and the potential of the node 112 is High, the potential of the first data line 104 is increased and the potential of the second data line 105 becomes Low. At this time, a differential amplifier circuit which reads a potential difference of the first data line 104 and the second data line 105 is used for the read/write circuit 123, so that it can be detected that the potential of the first data line 104 is higher than that of the second data line 105. In addition, in a case where the potential of the node 101 is higher than the precharge potential and the potential of the node 113 is High, in a similar manner, it can be detected that the potential of the second data line 105 is higher than that of the first data line 104.

Since the first transistor 106 and the sixth transistor 111 are turned on in a case where the potential of the node 101 is lower than the precharge potential and the potential of the node 112 is High, current flows from the first data line 104 to the node 101 through the node 112, so that the potential of the node 101 is increased. Thus, the potential of the first data line 104 is decreased, so that the potential of the node 101 and the potential of the first data line 104 are equal to each other to be stable. In addition, since the second transistor 107 and the third transistor 108 are turned on, the potential of the second data line 105 becomes Low. Note that although the potential of the first data line 104 is decreased even in this state, the potential of the first data line 104 is higher than that of the second data line 105; therefore, it can be detected that the potential of the first data line 104 is higher than that of the second data line 105 by a differential amplifier circuit. Moreover, also in a case where the potential of the node 101 is lower than the precharge potential and the potential of the node 113 is High, in a similar manner, it can be detected that the potential of the second data line 105 is higher than that of the first data line 104.

Next, a case where the SRAM cell 121 holds data is described.

In a case where power supply voltage is supplied to the decoder 122 and the read/write circuit 123, the potential of the word line is fixed to Low, and the first transistor 106 and the second transistor 107 are turned off. In addition, in a case where power supply voltage is not supplied to the decoder 122 and the read/write circuit 123, potentials of the decoder 122 and the read/write circuit 123 become zero, and the first transistor 106 and the second transistor 107 can be considered to be turned off.

For example, in a case where the potential of the node 112 is High and the potential of the node 113 is low, the third transistor 108 is turned on, and the node 113 maintains its low potential. Although the sixth transistor 111 is turned on because the potential of the gate electrode is Low, the state of the sixth transistor 111 is not changed in a case where the potentials of both the node 101 and the node 112 are High. In contrast, although the fourth transistor 109 and the fifth transistor 110 are turned on in a case where the potential of the node 112 is Low and the potential of the node 113 is High, the states of the fourth transistor 109 and the fifth transistor 110 are not changed in a case where the potentials of both the node 101 and the node 113 are High.

In this manner, the semiconductor memory device described in this embodiment mode has the structure in which the power storage unit 102 is charged through the SRAM cell 121 in a case where power supply voltage is supplied to the semiconductor memory device, and electric power is supplied to the SRAM cell 121 by electric discharge of the power storage unit 102 in a case where power supply voltage is not supplied to the semiconductor memory device.

Note that, in this explanation, the high potential is not necessarily the same potential as the power supply potential of the decoder 122 and the read/write circuit 123. For example, in a case where the potential of the node 101 is lower than the precharge potential, the potential of the node 112 is lower than the precharge potential even if the potential of the node 112 is High.

In a conventional SRAM cell, in general, power supply voltage supplied to the decoder 122 and the read/write circuit 123 and power supply voltage supplied to the node 101 are the same node; thus, the potential of the node 112 or the node 113 can be held in a case where power supply voltage is supplied to the semiconductor memory device, while the potential of the node 112 or the node 113 cannot be held in a case where power supply voltage is not supplied to the semiconductor memory device. In the SRAM cell 121 described in this embodiment mode, however, even in a case where power supply voltage is not supplied to the semiconductor memory device, electric power is supplied to the SRAM cell 121 by electric discharge of the power storage unit 102, and accordingly data can be held.

In addition, in the semiconductor memory device described in this embodiment mode, the node 101 to which the power storage unit 102 is connected differs from a power supply node of the decoder 122 or the read/write circuit 123, in order to prolong data holding time. That is, the power storage unit 102 does not supply power supply voltage to the decoder 122 or the read/write circuit 123.

Figure 3:
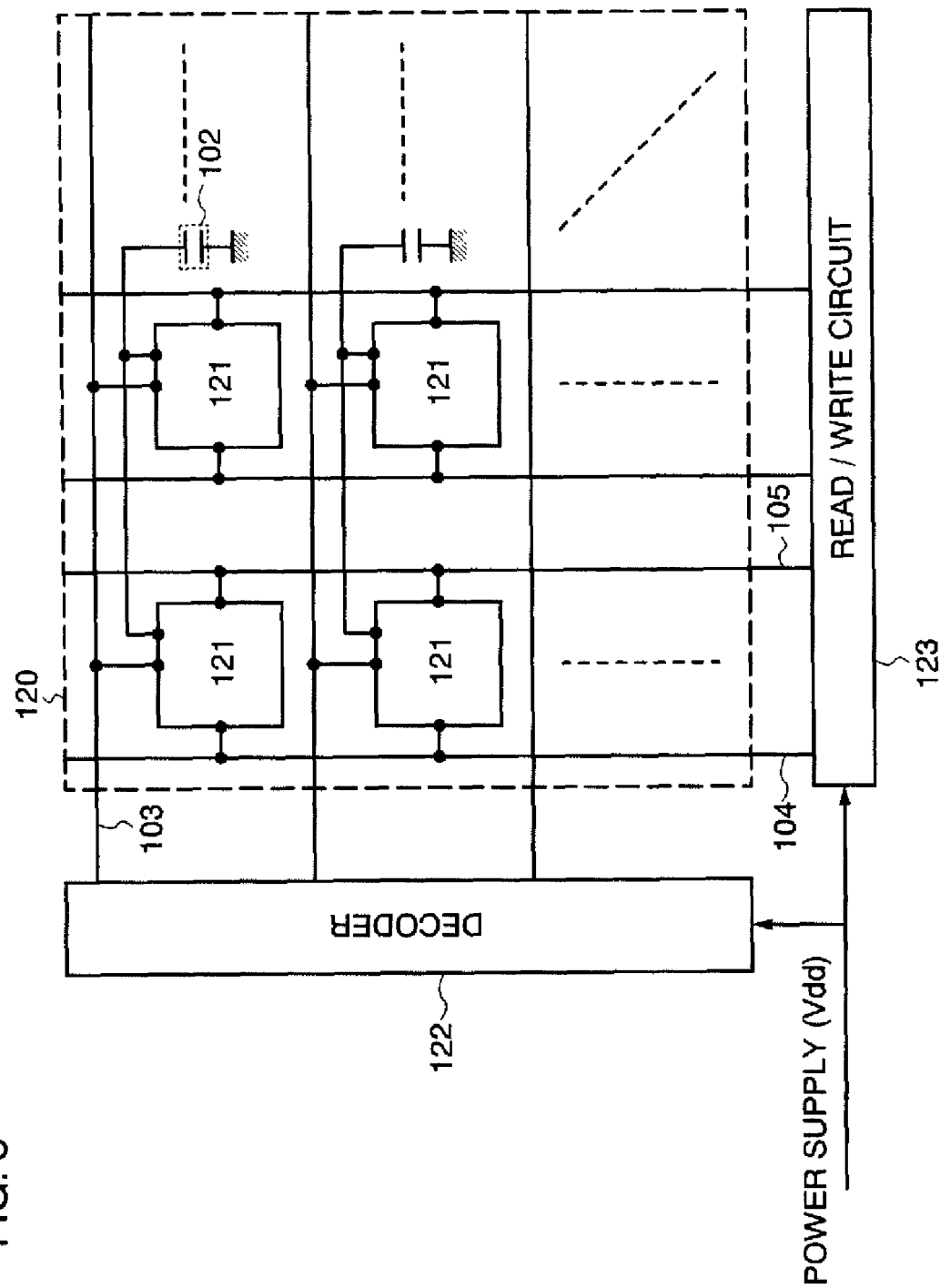
FIG. 3 is a diagram showing an example of a semiconductor memory device of the present invention.

Note that although the structure is described in which the power storage unit 102 is provided for each of the SRAM cells 121 in the above-described semiconductor memory device, the present invention is not limited thereto. For example, a structure may be employed in which the power storage unit 102 is provided for each row of the SRAM cells in the memory cell array 120 (see FIG. 3). Alternatively, needless to say, the following structure may be employed: a structure in which the power storage unit 102 is provided for each column of the SRAM cells, a structure in which the power storage unit 102 is provided for each block of the SRAM cells or a structure in which one power storage unit 102 is commonly provided for all SRAM cells 121. Providing the power storage unit 102 as described above makes it possible to reduce the number of power storage units 102 to be provided; thus, an area of the memory cell array 120 can be reduced. In addition, providing the power storage unit 102 as described above makes it possible to reduce the number of power storage units 102 to be charged. In other words, in a case of a structure in which one power storage unit 102 is provided for two SRAM cells 121, for example, if the power storage unit 102 is charged by writing of data to one of the SRAM cells 121, there is an effect of prolonging data holding time of data stored in the other of the SRAM cells 121, similarly to a case of performing refresh operation in a DRAM. On the other hand, in a structure in which the power storage unit 102 is provided for each of the SRAM cells 121, the capacity of one capacitor in a case of using the capacitor for the power storage unit can be smaller in comparison with a structure in which one power storage unit 102 is provided for a plurality of SRAM cells 121; thus, an effect in which the time until the potential of the node 101 is increased to an enough potential is short is obtained.

As described above, the semiconductor memory device described in this embodiment mode can hold data in the SRAM cell even in a case where electric power is not supplied from a reader, or a case where electric power is not enough. In addition, data cannot be rewritten because data is stored in a case of using a mask ROM. However, the use of the semiconductor memory device described in this embodiment mode makes it possible to rewrite and store data. Moreover, a structure in which electric power of the power storage unit which holds power supply voltage of the SRAM cell is not supplied to circuits other than the SRAM cell makes it possible to make the time for holding a potential longer than that in a structure in which power supply voltage is supplied to the circuits other than the memory cell. Furthermore, when the memory structure described in this embodiment mode, refresh operation like a case of a DRAM is not needed.

Note that the structure of the semiconductor memory device described in this embodiment mode can be freely combined with any of structures described in the other embodiment modes in this specification.

Embodiment Mode 2

In this embodiment mode, a semiconductor device (RFID) which includes an SRAM provided with the power storage unit described in Embodiment Mode 1 and performs data communication by wireless communication will be described with reference to a drawing.

A semiconductor device 200 described in this embodiment mode includes a logic portion 206 and an analog portion 215. The logic portion 206 includes a CPU 202, a mask ROM 203, an SRAM 204, and a controller 205. The analog portion 215 includes an antenna circuit 224, a power supply circuit 209, a reset circuit 210, a clock generation circuit 211, a demodulation circuit 212, a modulation circuit 213, and a power supply control circuit 214. The SRAM 204 may employ the structure described in Embodiment Mode 1: it includes a plurality of SRAM cells 121 and the power storage unit 102. The antenna circuit 224 includes an antenna 207 and a resonance circuit 208 (see FIG. 4).

The controller 205 includes a CPU interface (CPUIF) 216, a control register 217, a code extracting circuit 218, and an encoding circuit 219. Note that although communication signals are shown separately as a reception signal 220 and a transmission signal 221 in FIG. 4 for simplification of explanation, they are actually coupled with each other and transmitted and received simultaneously between the semiconductor device 200 and a reader. The reception signal 220 is demodulated by the demodulation circuit 212 after being received by the antenna circuit 224. In addition, the transmission signal 221 is transmitted from the antenna 207 after being modulated by the modulation circuit 213.

Figure 4:
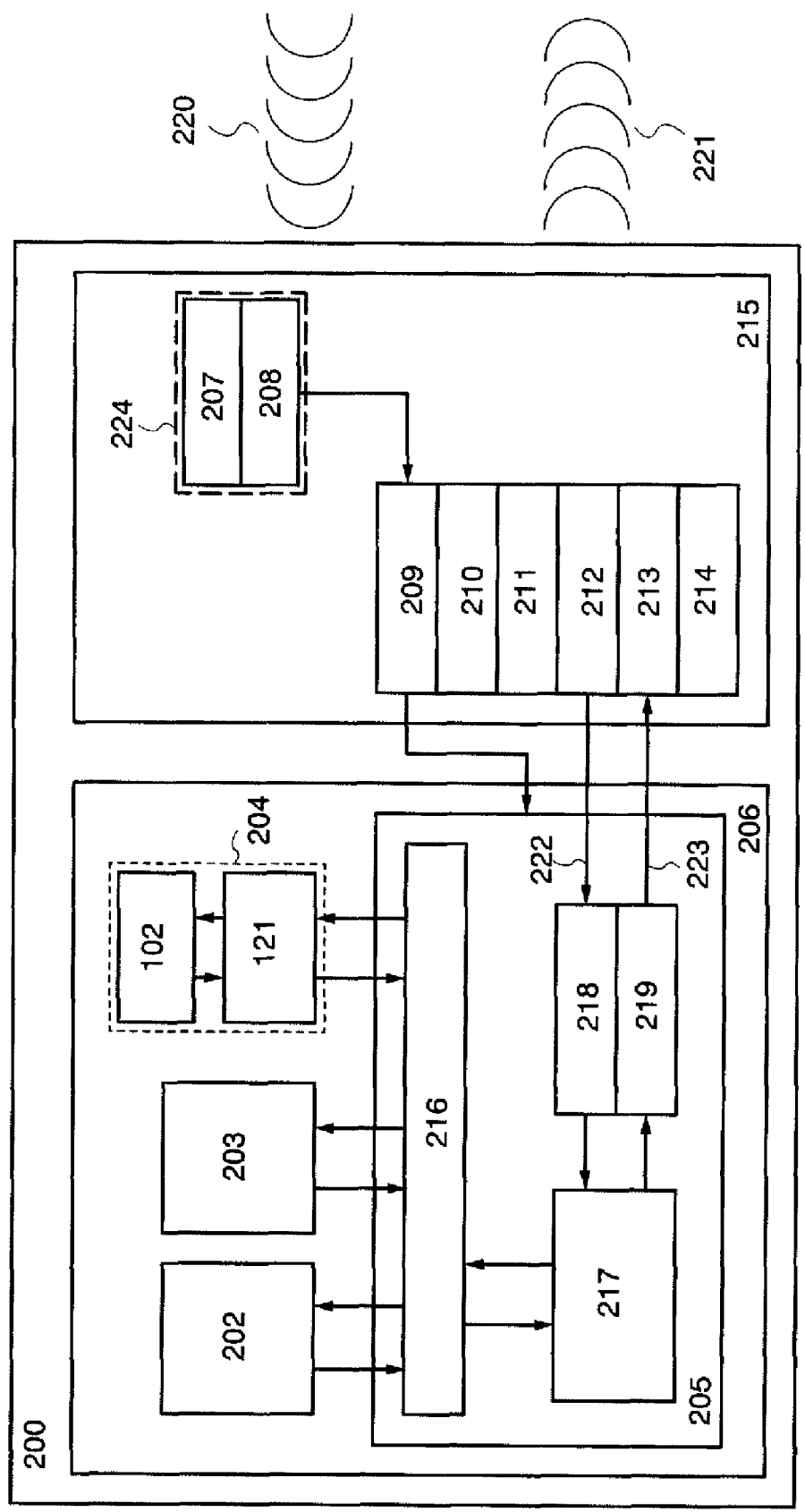
FIG. 4 is a diagram showing an example of a semiconductor device provided with a semiconductor memory device of the present invention.

In FIG. 4, when the semiconductor device 200 is placed in a magnetic field formed by the communication signal, induced electromotive force is generated by the antenna circuit 224. The induced electromotive force is held by an electric capacitor in the power supply circuit 209 and its potential is stabilized by the electric capacitor, and is supplied to each circuit in the semiconductor device 200 as power supply voltage. The reset circuit 210 generates an initial reset signal of the whole semiconductor device 200. For example, a signal which rises after increase in the power supply voltage is generated as the reset signal. The clock generation circuit 211 changes frequency and a duty ratio of a clock signal in accordance with a control signal generated by the power supply control circuit 214. The demodulation circuit 212 detects a change in amplitude of the reception signal 220 of an ASK method as received data 222 of "0"/"1". The demodulation circuit 212 is, for example, a low-pass filter. In addition, the modulation circuit 213 transmits transmission data by change of amplitude of the transmission signal 221 of an ASK method. For example, in a case where transmission data 223 is "0", the resonance point of the resonance circuit 208 is changed, so that the amplitude of the communication signal is changed. The power supply control circuit 214 monitors a power supply voltage supplied to the logic portion 206 from the power supply circuit 209 or current consumption in the logic portion 206. The power supply control circuit 214 generates a control signal for changing the frequency and the duty ratio of the clock signal in the clock generating circuit 211.

Next, the operation of the semiconductor device in this embodiment mode is described. When merchandise is managed in distribution industry, information about where and when merchandise passes is important. In addition, the information on location and time is given as an aspect by which consumers can obtain reliability of the manufacturer and merchandise. A case where information on location and time is written to the SRAM 204 mounted to the semiconductor device 200 by a reader is described below.

First, the semiconductor device 200 receives a reception signal 220 transmitted from the reader. The information on location and time to be written to the SRAM 204 is included in the reception signal 220. The reception signal 220 is, after being demodulated by the demodulation circuit 212, divided into control command, information on location and time, and the like by the code extracting circuit 118 to be stored in the control register 217. Here, the control command is data which specifies response of the semiconductor device 200. For example, transmission of a unique ID number, operation stop, decryption, and the like are specified.

Subsequently, in the logic portion 206, the CPU 202 writes the information on location and time into the SRAM 204 based on program data for writing stored in the mask ROM 203. In addition, rewriting operation is performed in a similar manner to the writing operation: the CPU 202 rewrites data stored in the SRAM 204 based on program data for rewriting stored in the mask ROM 203. The information on location and time once written to the SRAM 204 can obtain a response signal in such a manner that the semiconductor device 200 is made to receive the reception signal 220 including program data for reading the information on location and time.

The power storage unit 102 provided in the SRAM 204 functions as an electric power supply source for holding data of the SRAM cell 121.

Note that the CPU 202 accesses to the mask ROM 203, the SRAM 204, and the control register 217 through the CPUIF 216. The CPUIF 216 has a function of generating an access signal to any of the mask ROM 203, the SRAM 204, and the control register 217 based on an address required by the CPU 202.

Finally, in the encoding circuit 219, the transmission data 223 is generated based on the response signal, modulated by the modulation circuit 213, and transmitted to the reader by the antenna 207.

When this embodiment mode is used, reading directly from the SRAM is possible; thus, processing time can be reduced for difference in reading time. In addition, addition of the power storage unit makes it possible to hold the data written to the SRAM; thus, high-speed operation of a system right after resupply of power supply voltage is possible. In other words, data is stored by the SRAM of this embodiment mode even if enough electric power is not supplied temporarily from the reader; thus, a subsequent process can be performed right after the resupply of power supply voltage. Note that it is preferable to write data to a flash memory or the like in a case of storing data for a long time in a state where RFID is kept away from the reader and power supply voltage is not supplied.

Improvement of reading speed or writing speed as described above makes it possible to reduce communication time with the reader. A semiconductor device capable of data writing with reduced response time is attached to a manufacture or a manufacturing component, so that history information on a manufacturing process (e.g., unique ID, location of manufacture, and manufacturing time) can be obtained. Reduction in response time makes it possible to write data to the semiconductor device without slowing speed of a manufacturing line, and accordingly, introduction to the production line can be easily performed. In addition, information written to the semiconductor device is read at high speed, so that distribution to different processes in the middle of manufacture or separation of shipping destinations can be automatically performed; thus, production line can be made more efficient.

The above-described structure makes it possible to provide a semiconductor device with improved response speed.

The structure of the semiconductor device described in this embodiment mode can be freely combined with any of structures described in the other embodiment modes in this specification.

Embodiment Mode 3

In this embodiment mode, a structure of a semiconductor device which differs from that of Embodiment Mode 2 will be described with reference to drawings.

Figure 5:
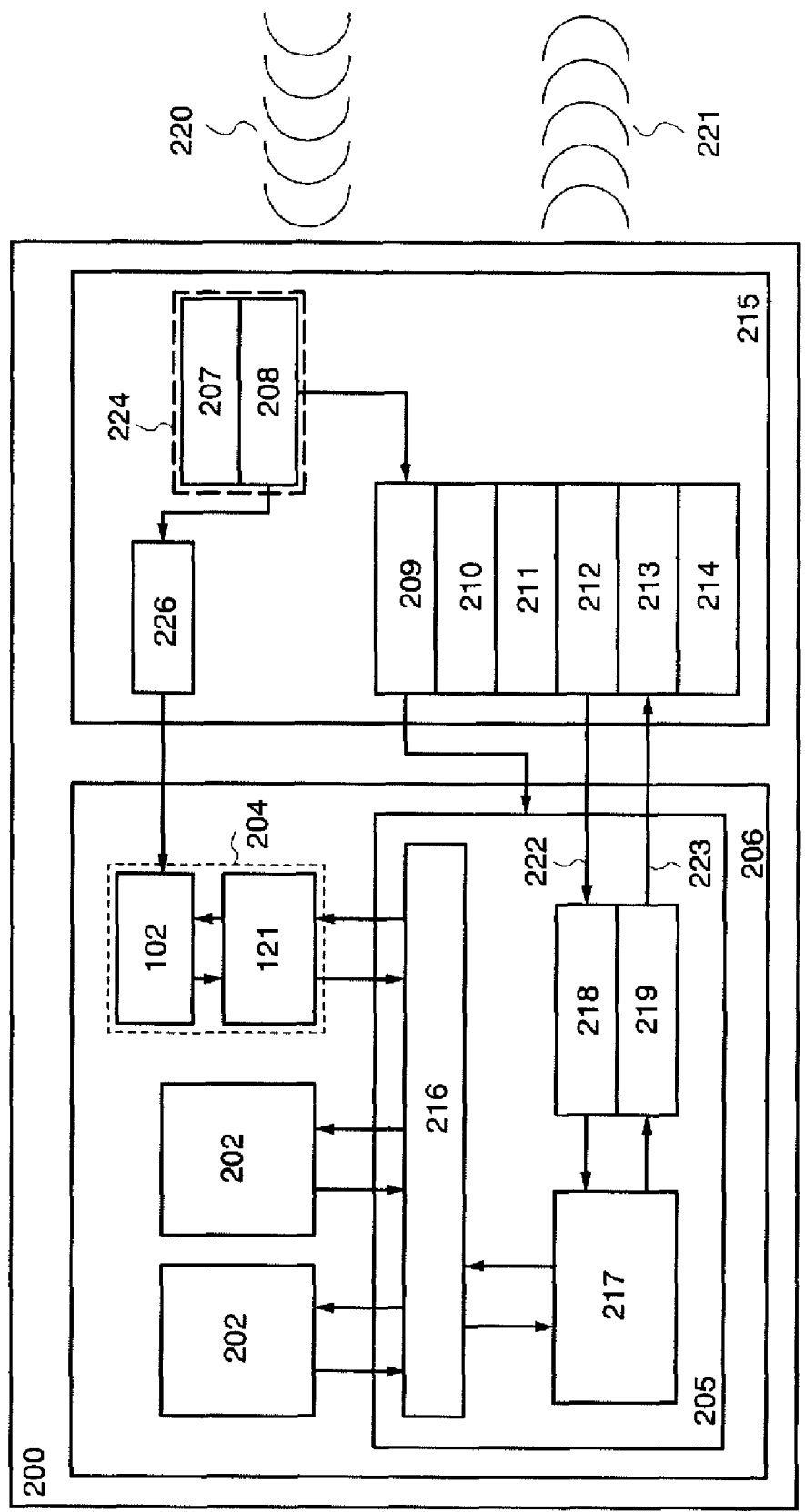
FIG. 5 is a diagram showing an example of a semiconductor device provided with a semiconductor memory device of the present invention.

A semiconductor device described in this embodiment mode includes a power supply portion 226 capable of supplying electric power to the power storage unit 102 (see FIG. 5). The power supply portion 226 has a function of rectifying electric power received by the antenna circuit 224 to supply the rectified electric power to the power storage unit 102. The power supply portion 226 may have a function of controlling power storage so that the power storage unit 102 is not overcharged. That is, the semiconductor device described in this embodiment mode has a structure in which the power supply portion 226 is added to the structure shown in FIG. 4. Such a structure makes it possible to charge the power storage unit 102 through the SRAM cell 121 and by supply of electric power from the power supply portion 226.

Next, the structure of an SRAM in the semiconductor device described in this embodiment mode is described with reference to FIG. 6.

The structure of the SRAM cell 121 may be similar to that shown in FIG. 1. Here, the power storage unit 102 and the power supply portion 226 are connected to each other through a diode element 252.

Figure 6:
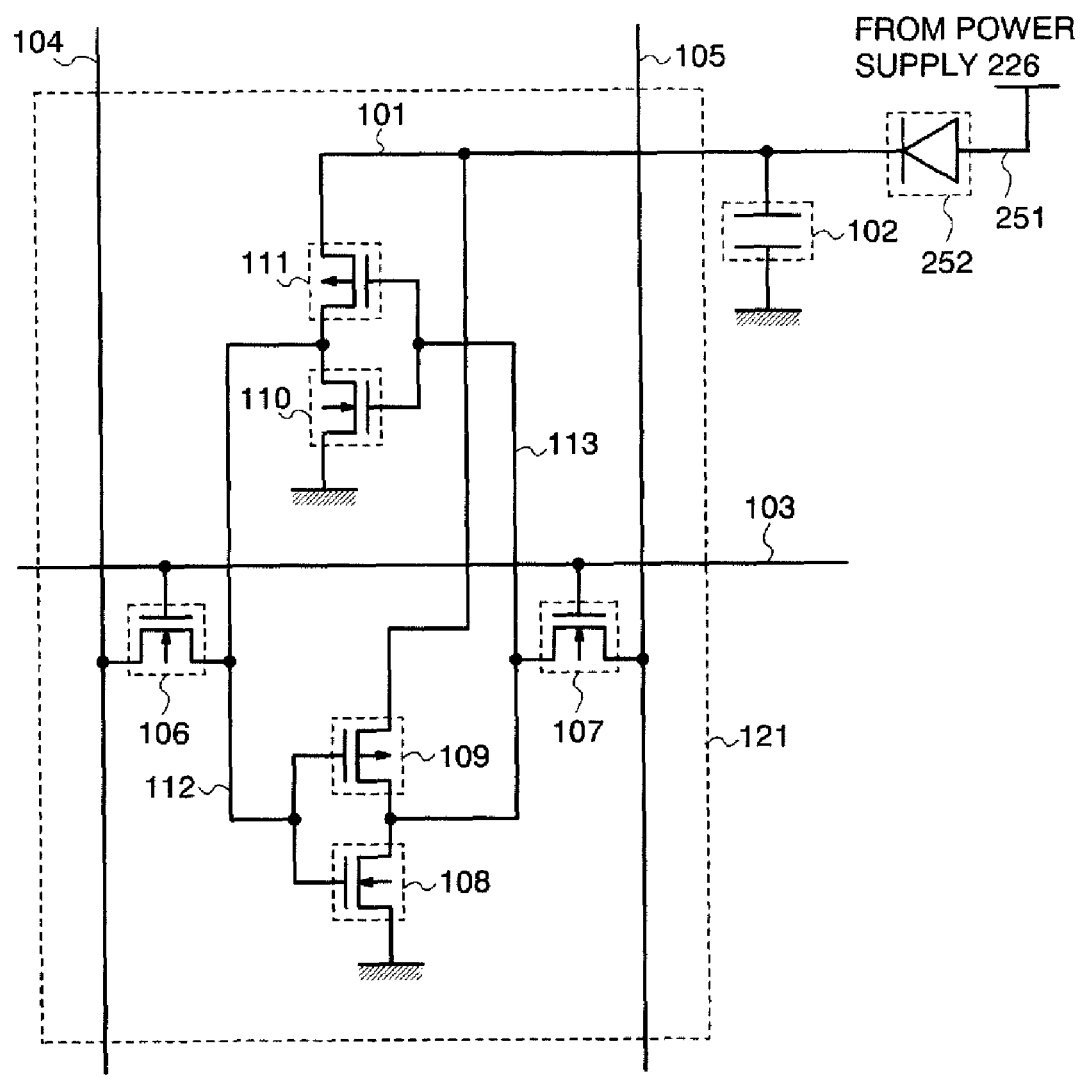
FIG. 6 is a diagram showing an example of an SRAM cell of a semiconductor memory device of the present invention.

In FIG. 6, in a case where a potential of a node 251 is higher than that of the node 101, current flows from the node 251 to the node 101 through a diode element 252, so that the potential of the node 101 is increased. However, in a case where the potential of the node 251 is lower than that of the node 101, the state described in Embodiment Mode 1 is obtained. Note that, here, a portion where the diode element 252 and the power supply portion 226 are connected to each other is the node 251.

The semiconductor device described in this embodiment mode has a feature in that, in a case where the semiconductor device has a plurality of power supplies and one or a plurality of power supplies could be turned off or run short, current flows from the node 112 or 113 to the node 101 using one of the power supplies as the node 251 and the other as a system power supply for the decoder 122, the read/write circuit 123, or the like.

The node 251 may be a node that differs from a system power supply for a decoder or the like, and may be power supply voltage which is generated in a rectifier circuit that differs from a rectifier circuit which generates system power supply voltage in RFID. In addition, in the structure shown in FIG. 6, the diode element 252 may be a diode-connected MOS transistor. In this case, if current which flows from the node 101 to the node 251 is high when the potential of the node 251 is lower than that of the node 101, decrease in potential of the node 101 becomes fast and data holding time is shortened; therefore, it is preferable that the current which flows from the node 101 to the node 251 be as low as possible.

Although a case where the potential of the node 101 is higher than zero is described in this embodiment mode, a structure may be employed in which a potential lower than zero is separated from the other circuits such as a decoder, with the use of another node, and stored in a power storage unit.

Note that the structure of the semiconductor memory device described in this embodiment mode can be freely combined with any of structures described in the other embodiment modes in this specification.

Embodiment Mode 4

A structure of an SRAM of the present invention is not limited to a memory used for RFID.

When a power supply of a system is turned off, a general SRAM uses a backup battery for holding data. If the structure of the SRAM of the present invention is used, data is held even if a power supply is temporarily turned off; thus, a circuit for preventing the power supply from being temporarily turned off when changing a battery is not needed. Since the structure of the SRAM of the present invention is not limited to a memory used for RFID, in a case where reduction in size or restriction of resistance-to-temperature characteristics, which becomes a problem in RFID, is not important and a battery can be used, in FIG. 6, for example, the node 251 may be a power supply node by a backup battery. The backup battery employs a structure in which power supply voltage is supplied to only the SRAM cell 121, so that the backup battery can reduce power consumption thereof in comparison with a case where the backup battery employs a structure in which power supply voltage is also supplied also to the decoder 122, the read/write circuit 123, or the like.

In addition, in a general nonvolatile memory such as an EEPROM, in some cases, data is written by a dedicated memory writing device, and the memory is separated from the writing device and installed in another device. If the memory structure of the present invention is used, data can be held even if power supply is temporarily turned off while the memory is separated from the writing device and installed in another device; thus, the memory to which data is written by the dedicated memory writing device can be separated from the writing device and installed in another device.

Note that the structure of the semiconductor memory device described in this embodiment mode can be freely combined with any of structures described in the other embodiment modes in this specification.

Embodiment Mode 5

In this embodiment mode, an example of a manufacturing method of the semiconductor device described in any of the above embodiment modes will be described with reference to drawings. In this embodiment mode, a case will be described where elements included in circuits of a semiconductor device, such as a logic portion provided with an SRAM and an analog portion including an antenna circuit or the like are provided over the same substrate, using a thin film transistor. In addition, a case where a power storage unit includes a thin film transistor type capacitor will be described. Needless to say, a structure can also be employed in which the power storage unit includes a small secondary battery instead of the thin film transistor type capacitor. Note that, in this embodiment mode, a case will be described where elements such as a thin film transistor are once formed over a supporting substrate, and then the elements are transferred to a flexible substrate.

First, a peeling layer 1303 is formed over one surface of a substrate 1301 with an insulating film 1302 interposed therebetween, and then an insulating film 1304 functioning as a base film and a semiconductor film (e.g., a film containing amorphous silicon) 1305 are formed thereover (see FIG. 7A). Note that the insulating film 1302, the peeling layer 1303, the insulating film 1304, and the semiconductor film 1305 can be formed consecutively.

The substrate 1301 is selected from a glass substrate, a quartz substrate, a metal substrate such as a stainless steel substrate, a ceramic substrate, a semiconductor substrate such as a Si substrate, an SOI (silicon on insulator) substrate, or the like. Alternatively, a plastic substrate made of polyethylene terephthalate (PET), polyethylene naphthalate (PEN), polyether sulfone (PES), acrylic, or the like can be selected. In this step, although the peeling layer 1303 is provided over the entire surface of the substrate 1301 with the insulating film 1302 interposed therebetween, the peeling layer 1303 can also be provided as selected by photolithography after being provided over the entire surface of the substrate 1301.

The insulating films 1302 and 1304 are formed using an insulating material such as silicon oxide ($SiO_x$), silicon nitride ($SiN_x$), silicon oxynitride ($SiO_xN_y$, where x>y), or silicon nitride oxide ($SiN_xO_y$, where x>y) by a CVD method, a sputtering method, or the like. For example, when each of the insulating films 1302 and 1304 is formed to have a two-layer structure, a silicon nitride oxide film may be formed as a first insulating film and a silicon oxynitride film may be formed as a second insulating film. Alternatively, a silicon nitride film may be formed as a first insulating film and a silicon oxide film may be formed as a second insulating film. The insulating film 1302 functions as a blocking layer which prevents an impurity element contained in the substrate 1301 from being mixed into the peeling layer 1303 or elements formed thereover. The insulating film 1304 functions as a blocking layer which prevents an impurity element contained in the substrate 1301 or the peeling layer 1303 from being mixed into elements formed over the insulating film 1304. In this manner, providing the insulating films 1302 and 1304 which function as blocking layers can prevent adverse effects on the elements formed over the peeling layer 1303 or the insulating film 1304, which would otherwise be caused by an alkali metal such as Na or an alkaline earth metal contained in the substrate 1301 or by an impurity element contained in the peeling layer 1303. Note that when quartz is used for the substrate 1301, for example, the insulating films 1302 and 1304 may be omitted.

The peeling layer 1303 may be formed using a metal film, a stacked structure of a metal film and a metal oxide film, or the like. As a metal film, either a single layer or stacked layers are formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing the element as its main component. In addition, such materials can be formed by a sputtering method, various CVD methods such as a plasma CVD method, or the like. A stacked structure or a metal film and a metal oxide film can be obtained by steps of forming the above-described metal film, applying plasma treatment thereto under an oxygen atmosphere or an $N_2O$ atmosphere or applying heat treatment thereto under an oxygen atmosphere or an $N_2O$ atmosphere, and thereby forming oxide or oxynitride of the metal film on the surface of the metal film. For example, when a tungsten film is provided as a metal film by a sputtering method, a CVD method, or the like, a metal oxide film formed of tungsten oxide can be formed on a surface of the tungsten film by application of plasma treatment to the tungsten film. In addition, after a metal film (e.g., tungsten) is formed, an insulating film formed of silicon oxide or the like may be formed over the metal film by a sputtering method, and also metal oxide (e.g., tungsten oxide over tungsten) may be formed over the metal film.

The amorphous semiconductor film 1305 is formed to have a thickness of 25 to 200 nm (preferably, 30 to 150 nm) by a sputtering method, an LPCVD method, a plasma CVD method, or the like.

Next, the amorphous semiconductor film 1305 is crystallized by laser light irradiation. Note that the crystallization of the amorphous semiconductor film 1305 may also be performed by a method combining the laser crystallization with a thermal crystallization method using RTA or an annealing furnace or with a thermal crystallization method using a metal element that promotes crystallization. After that, the crystalline semiconductor film is etched into a desired shape, whereby crystalline semiconductor films 1305a to 1305f are formed. Then, a gate insulating film 1306 is formed so as to cover the semiconductor films 1305a to 1305f (see FIG. 7B).

The gate insulating film 1306 is formed using an insulating material such as silicon oxide, silicon nitride, silicon oxynitride, or silicon nitride oxide by a CVD method, a sputtering method, or the like. For example, when the gate insulating film 1306 is formed to have a two-layer structure, it is preferable to form a silicon oxynitride film as a first insulating film and to form a silicon nitride oxide film as a second insulating film. Alternatively, it is also preferable to form a silicon oxide film as a first insulating film and to form a silicon nitride film as a second insulating film.

An example of a formation step of the crystalline semiconductor films 1305a to 1305f is briefly described below. First, an amorphous semiconductor film with a thickness of 50 to 60 nm is formed by a plasma CVD method. Then, a solution containing nickel which is a metal element that promotes crystallization is retained on the amorphous semiconductor film, which is followed by dehydrogenation treatment (500° C. for one hour) and thermal crystallization treatment (550° C. for four hours). Accordingly, a crystalline semiconductor film is formed. Thereafter, the crystalline semiconductor film is irradiated with laser light by photolithography and etched, whereby the crystalline semiconductor films 1305a to 1305f are formed. Note that crystallization of the amorphous semiconductor film may be performed only by laser light irradiation, not by thermal crystallization which uses a metal element that promotes crystallization.

As a laser oscillator used for crystallization, either a continuous wave laser (a CW laser) or a pulsed laser can be used. As a laser that can be used here, there are gas lasers such as an Ar laser, a Kr laser, and an excimer laser; a laser in which single-crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ is doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser. When irradiation is performed with the fundamental wave of such a laser beam or the second to fourth harmonics of the fundamental wave, crystals with a large grain size can be obtained. For example, the second harmonic (532 nm) or the third harmonic (355 nm) of an Nd:$YVO_4$ laser (the fundamental wave of 1064 nm) can be used. In this case, a laser power density of approximately 0.01 to 100 $MW/cm^2$ (preferably, 0.1 to 10 $MW/cm^2$) is needed, and irradiation is performed with a scanning rate of approximately 10 to 2000 cm/sec. Note that the laser in which single crystal YAG $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ is doped with one or more of Nd, Yb, Cr, Ti, Ho, Er, Tm, and Ta as a dopant; an Ar ion laser, or a Ti:sapphire laser can be used as a CW laser, whereas it can also be used as pulsed laser with a repetition rate of 10 MHz or more by a Q-switch operation, mode locking, or the like. When a laser beam with a repetition rate of 10 MHz or more is used, a semiconductor film is irradiated with the next pulse during the period in which the semiconductor film is melted by the previous laser and solidified. Therefore, unlike the case of using a pulsed laser with a low repetition rate, a solid-liquid interface in the semiconductor film can be continuously moved. Thus, crystal grains which have grown continuously in the scanning direction can be obtained.

The gate insulating film 1306 may be formed by oxidization or nitridation of the surfaces of the semiconductor films 1305a to 1305f by high-density plasma treatment. For example, plasma treatment with a mixed gas of a rare gas such as He, Ar, Kr, or Xe, and oxygen, nitrogen oxide ($NO_2$), ammonia, nitrogen, or hydrogen is used. When plasma is excited by introduction of microwaves, plasma with a low electron temperature and high density can be generated. With oxygen radicals (which may include OH radicals) or nitrogen radicals (which may include NH radicals) which are generated by the high-density plasma, the surfaces of the semiconductor films can be oxidized or nitrided.

By such high-density plasma treatment, an insulating film with a thickness of 1 to 20 nm, typically 5 to 10 nm, is formed on the semiconductor films. Since the reaction in this case is a solid-phase reaction, interface state density between the insulating film and the semiconductor films can be quite low. Since such high-density plasma treatment directly oxidizes (or nitrides) the semiconductor films (crystalline silicon or polycrystalline silicon), the insulating film can be formed with extremely little unevenness, which is ideal. In addition, since crystal grain boundaries of crystalline silicon are not strongly oxidized, an excellent state is obtained. That is, by the solid-phase oxidation of the surfaces of the semiconductor films by high-density plasma treatment which is described in this embodiment mode, an insulating film with a uniform thickness and low interface state density can be formed without excessive oxidation reaction at the crystal grain boundaries.

As the gate insulating film, only an insulating film formed by high-density plasma treatment may be used, or a stacked layer which is obtained by deposition of an insulating film such as silicon oxide, silicon oxynitride, or silicon nitride on the insulating film by a CVD method using plasma or thermal reaction. In either case, a transistor which includes an insulating film formed by high-density plasma treatment in part or the whole of its gate insulating film can have small characteristic variations.

In addition, the semiconductor films 1305a to 1305f, which are obtained by irradiation of a semiconductor film with a continuous wave laser beam oscillated with a repetition rate of 10 MHz or more and scanning of the semiconductor film in one direction to crystallize the semiconductor film, have a characteristic in that their crystals grow in a beam scanning direction. A transistor is arranged so that its channel length direction (direction in which carriers move when a channel formation region is formed) is aligned with the scanning direction, and the above-described gate insulating film is combined with the semiconductor film, whereby a thin film transistor (TFTs) with high electron field effect mobility and few variations in characteristics can be obtained.

Note that since the semiconductor film 1305f is used as an electrode of a capacitor in this embodiment mode, an impurity element is introduced into the semiconductor film 1305f. Specifically, the semiconductor films 1305a to 1305e are covered by a resist before or after forming the gate insulating film 1306, and an impurity element imparting n-type or p-type can be introduced as selected into the semiconductor film 1305f by an ion doping method or an ion injecting method. As an n-type impurity element, phosphorus (P), arsenic (As), or the like can be used. As a p-type impurity element, boron (B), aluminum (Al), gallium (Ga), or the like can be used. Here, phosphorus (P) is used as the impurity element, and introduced as selected into the semiconductor film 1305f.

Next, a first conductive film and a second conductive film are stacked over the gate insulating film 1306. Here, the first conductive film is formed to a thickness of 20 to 100 nm by a CVD method, a sputtering method, or the like. The second conductive film is formed to a thickness of 100 to 400 nm. The first conductive film and the second conductive film are formed of an element selected from tantalum (Ta), tungsten (W), titanium (Ti), molybdenum (Mo), aluminum (Al), copper (Cu), chromium (Cr), niobium (Nb), and the like, or an alloy material or a compound material containing the element as its main component. Alternatively, the first conductive film and the second conductive film are formed of a semiconductor material typified by polycrystalline silicon doped with an impurity element such as phosphorus. As a combination example of the first conductive film and the second conductive film, a tantalum nitride film and a tungsten film; a tungsten nitride film and a tungsten film; a molybdenum nitride film and a molybdenum film; or the like can be given. Tungsten and tantalum nitride have high heat resistance. Therefore, after forming the first conductive film and the second conductive film, thermal treatment for the purpose of heat activation can be applied thereto. In addition, in a case where a two-layer structure is not employed, but a three-layer structure is employed, it is preferable to use a stacked structure of a molybdenum film, an aluminum film, and a molybdenum film.

Next, a resist mask is formed by photolithography, and etching treatment for forming a gate electrode and a gate line is applied. Thus, gate electrodes 1307 are formed over the semiconductor films 1305a to 1305f. Here, a stacked structure of a first conductive film 1307a and a second conductive film 1307b is shown as an example of the gate electrode 1307.

Next, the semiconductor films 1305a to 1305f are doped with an n-type impurity element at low concentration, using the gate electrodes 1307 as masks by an ion doping method or an ion implantation method. Then, a resist mask is formed as selected by photolithography, and the semiconductor films 1305c and 1305e are doped with a p-type impurity element at high concentration. As an n-type impurity element, phosphorus (P), arsenic (As), or the like can be used. As a p-type impurity element, boron (B), aluminum (Al), gallium (Ga), or the like can be used. Here, phosphorus (P) is used as an n-type impurity element and is introduced as selected into the semiconductor films 1305a to 1305f so as to be contained at concentrations of $1 \times 10^{15}$ to $1 \times 10^{19}/cm^3$. Thus, n-type impurity regions 1308 are formed. In addition, boron (B) is used as a p-type impurity element, and is introduced as selected into the semiconductor films 1305c and 1305e so as to be contained at concentrations of $1 \times 10^{19}$ to $1 \times 10^{20}/cm^3$. Thus, n-type impurity regions 1309 are formed (see FIG. 7C).

Subsequently, an insulating film is formed so as to cover the gate insulating film 1306 and the gate electrodes 1307. The insulating film is formed to have either a single layer or a stacked layer of a film containing an inorganic material such as silicon, silicon oxide, or silicon nitride, or a film containing an organic material such as an organic resin by a plasma CVD method, a sputtering method, or the like. Next, the insulating film is etched as selected by anisotropic etching (mainly in a perpendicular direction), so that insulating films 1310 (also referred to as sidewalls) which are in contact with the side surfaces of the gate electrodes 1307 are formed. The insulating films 1310 are used as doping masks for forming LDD (lightly doped drain) regions.

Next, the semiconductor films 1305a, 1305b, 1305d, and 1305f are doped with an n-type impurity element at high concentration, using a resist mask formed by photolithography, the gate electrodes 1307, and the insulating films 1310 as masks. Thus, n-type impurity regions 1311 are formed. Here, phosphorus (P) is used as an n-type impurity element, and is introduced as selected into the semiconductor films 1305a, 1305b, 1305d, and 1305f so as to be contained at concentrations of $1\times10^{19}$ to $1\times10^{20}/cm^3$. Thus, the n-type impurity regions 1311 with higher concentration than the impurity regions 1308 are formed.

Through the above-described steps, n-channel transistors 1300a, 1300b, and 1300d; p-channel thin film transistors 1300c and 1300e; and a capacitor 1300f are formed (see FIG. 7D).

In the n-channel thin film transistor 1300a, a channel formation region is formed in a region of the semiconductor film 1305a which overlaps with the gate electrode 1307; the impurity region 1311 which forms a source region or a drain region is formed in a region of the semiconductor film 1305a which does not overlap with the gate electrode 1307 and the insulating film 1310; and a low concentration impurity region (LDD region) is formed in a region of the semiconductor film 1305a which overlaps with the insulating film 1310 and between the channel formation region and the impurity region 1311. In a similar manner, a channel formation region, a low concentration impurity region, and the impurity region 1311 are formed in each of the n-channel thin film transistors 1300b and 1300d.

In the p-channel thin film transistor 1300c, a channel formation region is formed in a region of the semiconductor film 1305c which overlaps with the gate electrode 1307, and the impurity region 1309 which forms a source region or a drain region is formed in a region of the semiconductor film 1305c which does not overlap with the gate electrode 1307. In a similar manner, a channel formation region and the impurity region 1309 are formed in the p-channel thin film transistor 1300e. Here, although an LDD region is not formed in each of the p-channel thin film transistors 1300c and 1300e, an LDD region may be provided in each of the p-channel thin film transistors or a structure without LDD region may be applied to each of the n-channel thin film transistors.

Figure 8A:
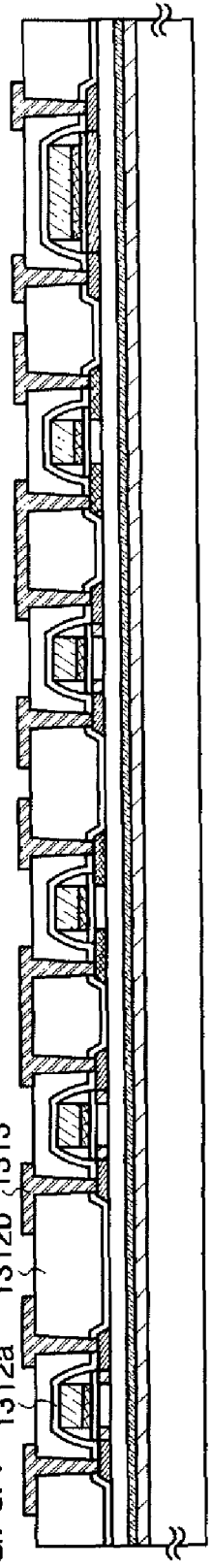
FIGS. 8A to 8C are views showing an example of a manufacturing method of a semiconductor device of the present invention.

Next, an insulating film with a single layer or stacked layers is formed so as to cover the semiconductor films 1305a to 1305f, the gate electrodes 1307, and the like. Then, conductive films 1313 electrically connected to the impurity regions 1309 and 1311 which form the source and drain regions of the thin film transistors 1300a to 1300e and one of electrodes of the capacitor 1300f are formed over the insulating film (see FIG. 8A). The insulating film is formed of a single layer or a stacked layer, using an inorganic material such as silicon oxide or silicon nitride, an organic material such as polyimide, polyamide, benzocyclobutene, acrylic, or epoxy, a siloxane material, or the like by a CVD method, a sputtering method, an SOG method, a droplet discharging method, a screen printing method, or the like. Here, the insulating film is formed to have two layers, and a silicon nitride oxide film is formed as a first insulating film 1312a and a silicon oxynitride film is formed as a second insulating film 1312b. In addition, the conductive films 1313 can form the source and drain electrodes of the thin film transistors 1300a to 1300e. Note that a siloxane material corresponds to a material having a bond of Si—O—Si. Siloxane has a skeleton structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent. Further alternatively, both a fluoro group and an organic group containing at least hydrogen may be used as the substituent.

Note that before the insulating films 1312a and 1312b are formed or after one or both of them is/are formed, heat treatment is preferably applied for recovery of the crystallinity of the semiconductor films, activation of the impurity element which has been added into the semiconductor films, or hydrogenation of the semiconductor films. As the heat treatment, thermal annealing, laser annealing, RTA, or the like is preferably applied.

The conductive films 1313 are formed of a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing the element as its main component. An alloy material containing aluminum as its main component corresponds to, for example, an alloy material which contains aluminum as its main component and also contains nickel, or a material which contains aluminum as its main component and also contains nickel and one or both of carbon and silicon. The conductive films 1313 are preferably formed to have a stacked structure of a barrier film, an aluminum-silicon (Al—Si) film, and a barrier film or a stacked structure of a barrier film, an aluminum silicon (Al—Si) film, a titanium nitride film, and a barrier film. Note that the "barrier film" corresponds to a thin film formed of titanium, titanium nitride, molybdenum, or molybdenum nitride. Aluminum and aluminum silicon are the most suitable material for forming the conductive films 1313 because they have a low resistance value and are inexpensive. When barrier layers are provided as the top layer and the bottom layer, generation of hillocks of aluminum or aluminum silicon can be prevented. In addition, if a barrier film formed of titanium which is an element having a high reducing property is formed, even when there is a thin natural oxide film formed on the crystalline semiconductor film, the natural oxide film can be chemically reduced, and a favorable contact between the conductive film 1313 and the crystalline semiconductor film can be obtained.

Next, an insulating film 1314 is formed so as to cover the conductive films 1313. A conductive film 1316 electrically connected to the conductive film 1313 which forms the source electrode or drain electrode of the thin film transistor 1300a is formed over the insulating film 1314. The conductive film 1316 may be formed using any of the above-described materials which have been described for the conductive film 1313.

Figure 8B:
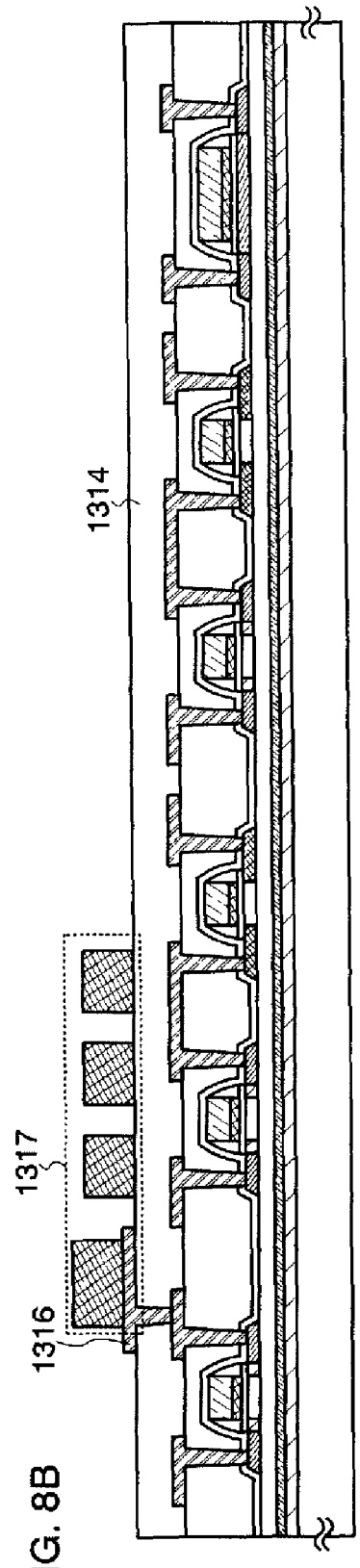

Next, a conductive film 1317 functioning as an antenna is formed so as to be electrically connected to the conductive film 1316 (see FIG. 8B).

The insulating film 1314 can be formed of a single layer or a stacked layer of an insulating film containing oxygen or nitrogen such as silicon oxide, silicon nitride, silicon oxynitride, or silicon nitride oxide; a film containing carbon such as DLC (diamond-like carbon); an organic material such as epoxy, polyimide, polyamide, polyvinyl phenol, benzocyclobutene, or acrylic; or a siloxane material such as a siloxane resin.

The conductive film 1317 can be formed of a conductive material by a CVD method, a sputtering method, a printing method such as screen printing or gravure printing, a droplet discharging method, a dispenser method, a plating method, or the like. The conductive film 1317 is formed of a single layer or a stacked layer of an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing the element as its main component.

For example, when the conductive film 1317 functioning as an antenna is formed by a screen printing method, the antenna can be provided by selective printing of a conductive paste in which conductive particles with a grain diameter of several nm to several tens of µm are dissolved or dispersed in an organic resin. The conductive particles can be at least one or more of metal particles selected from silver (Ag), gold (Ag), copper (Cu), nickel (Ni), platinum (Pt), palladium (Pd), tantalum (Ta), molybdenum (Mo), titanium (Ti), and the like; fine particles of silver halide; and dispersive nanoparticles. In addition, the organic resin included in the conductive paste can be one or more of organic resins which function as a binder, a solvent, a dispersing agent, and a coating material of the metal particles. Typically, an organic resin such as an epoxy resin and a silicone resin can be given as examples. In addition, it is preferable to form the conductive film by the steps of providing a conductive paste and baking it. For example, in a case of using fine particles (e.g., a grain diameter of greater than or equal to 1 nm and less than or equal to 100 nm) containing silver as its main component as a material of the conductive paste, the conductive paste is baked and hardened at temperatures in a range of 150 to 300° C., so that the conductive film can be obtained. Alternatively, it is also possible to use fine particles containing solder or lead-free solder as its main component. In that case, fine particles with a grain diameter of less than or equal to 20 μm are preferably used. Solder and lead-free solder have the advantage of low cost.

Figure 8C:
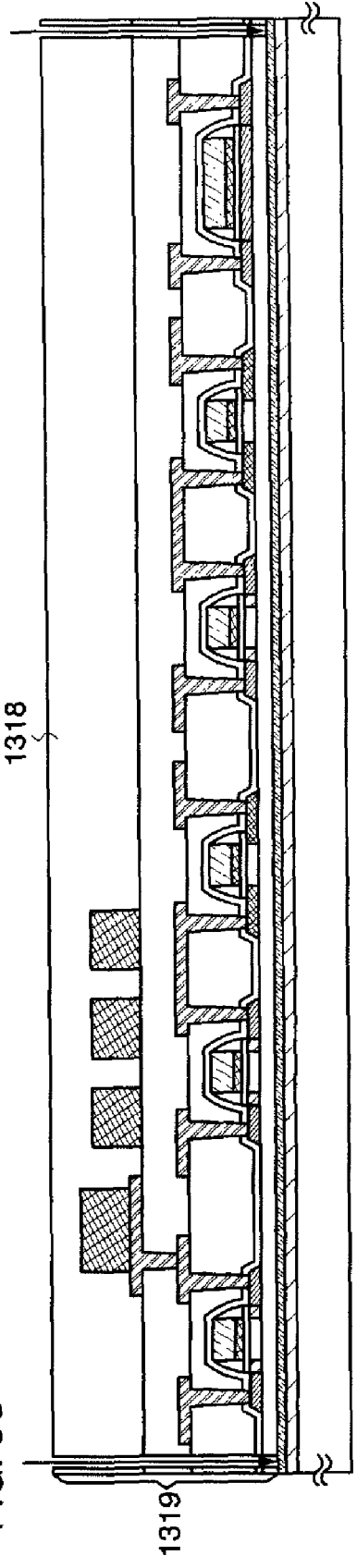

Next, after forming an insulating film 1318 so as to cover the conductive film 1317, a layer including the thin film transistors 1300a to 1300e, the capacitor 1300f, the conductive film 1317, and the like (hereinafter referred to as an "element formation layer 1319") are peeled off from the substrate 1301. Here, after forming openings in the element formation layer 1319 excluding the region of the thin film transistors 1300a to 1300e and the capacitor 1300f by laser light irradiation (e.g., UV light) (see FIG. 8C), the element formation layer 1319 can be peeled off the substrate 1301 with a physical force. Note that when peeling of the element formation layer 1319 is performed while wetting the element formation layer 1319 with liquid such as water, the thin film transistors provided in the element formation layer 1319 can be prevented from being broken down due to static electricity. In addition, by reuse of the substrate 1301 from which the element formation layer 1319 has been peeled off, cost reduction can be achieved.

The insulating film 1318 can be formed of a single layer or a stacked layer of an insulating film containing oxygen or nitrogen such as silicon oxide, silicon nitride, silicon oxynitride, or silicon nitride oxide; a film containing carbon such as DLC (diamond-like carbon); an organic material such as epoxy, polyimide, polyamide, polyvinyl phenol, benzocyclobutene, or acrylic; or a siloxane material such as a siloxane resin by a CVD method, a sputtering method, or the like.

Figure 9A:
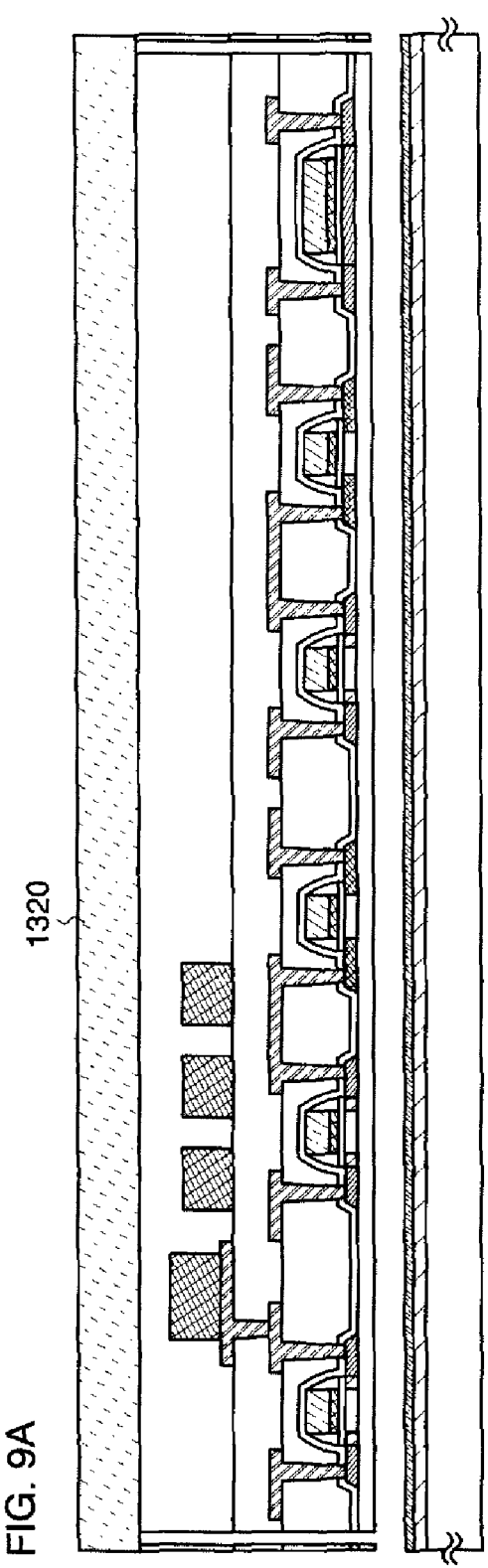
FIGS. 9A and 9B are views showing an example of a manufacturing method of a semiconductor device of the present invention.

In this embodiment, after forming the openings in the element formation layer 1319 by laser light irradiation, a first sheet material 1320 is attached to one of surfaces of the element formation layer 1319 (the surface where the insulating film 1318 is exposed), and then the element formation layer 1319 is peeled off from the substrate 1301 (see FIG. 9A).

Figure 9B:
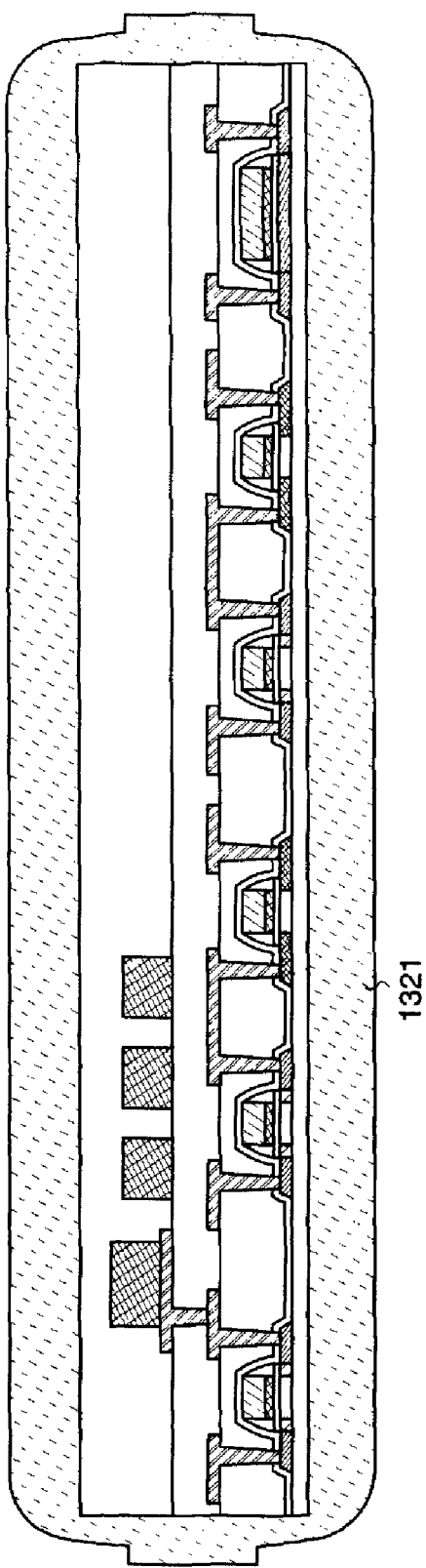

Next, a second sheet material 1321 is attached to the other surface of the element formation layer 1319 (the surface exposed by peeling), followed by one or both of heat treatment and pressurization treatment (see FIG. 9B). As the first sheet material 1320 and the second sheet material 1321, a hot-melt film or the like can be used.

As the first sheet material 1320 and the second sheet material 1321, a film on which antistatic treatment for preventing static electricity or the like has been applied (hereinafter referred to as an antistatic film) can be used. As examples of the antistatic film, a film in which an antistatic material is dispersed in a resin, a film to which an antistatic material is attached, and the like can be given. The film provided with an antistatic material can be a film with an antistatic material provided over one of its surfaces, or a film with an antistatic material provided over each of its surfaces. The film with an antistatic material provided over one of its surfaces may be attached to the layer so that the antistatic material is placed on the inner side of the film or the outer side of the film. The antistatic material may be provided over the entire surface of the film, or over part of the film. As an antistatic material, a metal, indium tin oxide (ITO), or a surfactant such as an amphoteric surfactant, a cationic surfactant, or a nonionic surfactant can be used. In addition, as an antistatic material, a resin material which contains a cross-linked copolymer having a carboxyl group and a quaternary ammonium base on its side chain, or the like can be used. Such a material is attached, mixed, or applied to a film, so that an antistatic film can be formed. The element formation layer is sealed using the antistatic film, so that the semiconductor elements can be prevented from adverse effects such as external static electricity when dealt with as a commercial product.

Note that the structure of the transistor can be various without being limited to the specific structure described in this embodiment. For example, a multi-gate structure having two or more gate electrodes may be employed. When a multi-gate structure is employed, a structure in which channel regions are connected in series is provided; therefore, a structure in which a plurality of transistors is connected in series is provided. When a multi-gate structure is employed, various advantages can be obtained in that off-current can be reduced; withstand voltage of the transistor can be increased, so that the reliability is increased; and even if drain-source voltage changes when the transistor operates in a saturation region, a drain-source current does not change very much, and thus flat characteristics can be obtained. In addition, a structure in which gate electrodes are formed above and below a channel may also be employed. When a structure in which gate electrodes are formed above and below a channel is employed, a channel region is enlarged. Thus, a current value is increased and a depletion layer can be easily formed, so that threshold swing (S value) can be decreased. When gate electrodes are formed above and below a channel, a structure in which a plurality of transistors is connected in parallel is provided.

In addition, any of the following structures may be employed: a structure in which a gate electrode is formed above a channel; a structure in which a gate electrode is formed below a channel; a staggered structure; and an inversely staggered structure. A channel region may be divided into a plurality of regions, or a plurality of channel regions may be connected in parallel or in series. In addition, a channel (or part thereof) may overlap with a source electrode or a drain electrode. When a structure in which a channel (or part thereof) overlaps with a source electrode or a drain electrode is employed, electric charge can be prevented from being accumulated in part of the channel and unstable operation can be prevented. In addition, an LDD (lightly doped drain) region may be provided. When an LDD region is provided, off-current can be reduced; the withstand voltage of the transistor can be increased, so that the reliability is increased; and even if drain-source voltage changes when the transistor operates in a saturation region, drain-source current does not change very much, and thus flat characteristics can be obtained.

Note that the manufacturing method of the semiconductor device of this embodiment mode can be applied to the semiconductor devices of other embodiment modes described in this specification.

Embodiment Mode 6

In this embodiment mode, a manufacturing method of a semiconductor device which differs from that described in Embodiment Mode 5 will be described with reference to drawings. In this embodiment mode, a case will be described where elements included in circuits of a semiconductor device, such as a logic portion provided with an SRAM and an analog portion including an antenna circuit or the like are provided over the same substrate. In addition, in this embodiment mode, an example in which a power storage unit is formed from a small secondary battery will be described. Needless to say, a structure can also be employed in which the power storage unit can be formed from a capacitor instead of a secondary battery.

First, element separation regions 2304 and 2306 (hereinafter simply referred to as regions 2304 and 2306) are formed in a semiconductor substrate 2300 (see FIG. 23A). The regions 2304 and 2306 provided in the semiconductor substrate 2300 are insulated from each other by an insulating film (also referred to as a field oxide film) 2302. The example shown here is a case where a single crystal Si substrate having n-type conductivity is used as the semiconductor substrate 2300, and a p-well 2307 is formed in the region 2306 of the semiconductor substrate 2300.

Any substrate can be used as the substrate 2300 as long as it is a semiconductor substrate. For example, a single crystal Si substrate having n-type or p-type conductivity, a compound semiconductor substrate (e.g., a GaAs substrate, an InP substrate, a GaN substrate, a SiC substrate, a sapphire substrate, or a ZnSe substrate), an SOI (silicon on insulator) substrate formed by a bonding method or a SIMOX (separation by implanted oxygen) method, or the like can be used.

The element separation regions 2304 and 2306 can be formed by a selective oxidation (LOCOS: local oxidation of silicon) method, a trench isolation method, or the like.

In addition, the p-well 2307 formed in the region 2306 of the semiconductor substrate 2300 can be formed by selective doping of the semiconductor substrate 2300 with a p-type impurity element. As a p-type impurity element, boron (B), aluminum (Al), gallium (Ga), or the like can be used.

Note that, in this embodiment, although the region 2304 is not doped with an impurity element because an n-type semiconductor substrate is used as the semiconductor substrate 2300, an n-well may be formed in the region 2304 by introduction of an n-type impurity element. As an n-type impurity element, phosphorus (P), arsenic (As), or the like can be used. When a p-type semiconductor substrate is used, on the other hand, a structure may be used in which the region 2304 is doped with an n-type impurity element to form an n-well, whereas the region 2306 is not doped with an impurity element.

Figure 10A:
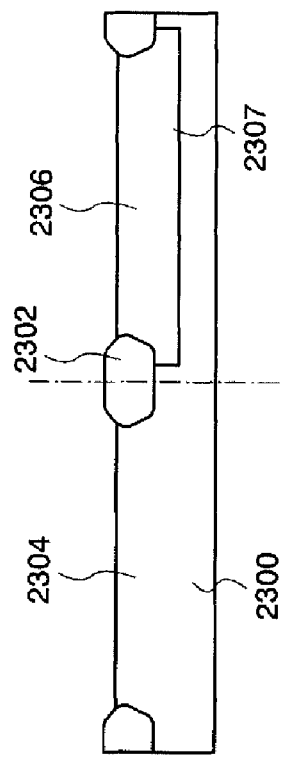
FIGS. 10A to 10C are views showing an example of a manufacturing method of a semiconductor device of the present invention.
Figure 10B:
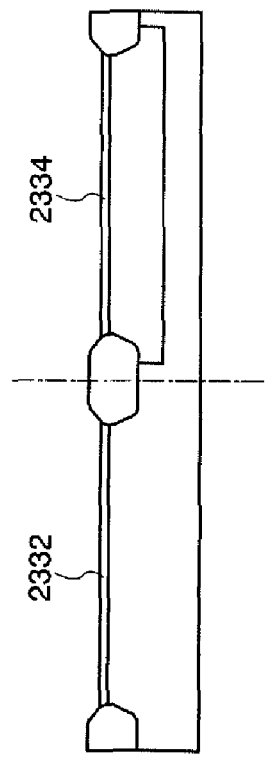

Next, insulating films 2332 and 2334 are formed over the surfaces of the regions 2304 and 2306, respectively (see FIG. 10B).

For example, surfaces of the regions 2304 and 2306 provided over the semiconductor substrate 2300 are oxidized by heat treatment, so that the insulating films 2332 and 2334 can be formed of a silicon oxide film. Alternatively, the insulating films 2332 and 2334 can be formed to have a stacked structure of a silicon oxide film and a film containing oxygen and nitrogen (a silicon oxynitride film) by steps of forming a silicon oxide film by a thermal oxidation method and then nitriding the surface of the silicon oxide film by nitridation treatment.

Further alternatively, the insulating films 2332 and 2334 may be formed by plasma treatment as described above. For example, the insulating films 2332 and 2334 can be formed using a silicon oxide film or a silicon nitride film which is obtained by application of high-density plasma oxidation or high-density nitridation treatment to the surfaces of the regions 2304 and 2306 provided in the semiconductor substrate 2300. In addition, after application of high-density plasma oxidation treatment to the surfaces of the regions 2304 and 2306, high-density plasma nitridation treatment may be conducted. In that case, silicon oxide films are formed on the surfaces of the regions 2304 and 2306, and then silicon oxynitride films are formed on the silicon oxide films. Thus, the insulating films 2332 and 2334 are each formed to have a stacked structure of the silicon oxide film and the silicon oxynitride film. In addition, after silicon oxide films are formed on the surfaces of the regions 2304 and 2306 by a thermal oxidation method, and then high-density plasma oxidation treatment or high-density plasma nitridation treatment may be performed to the silicon oxide films.

Note that the insulating films 2332 and 2334 formed respectively over the regions 2304 and 2306 of the semiconductor substrate 2300 function as the gate insulating films of transistors to be completed later.

Figure 10C:
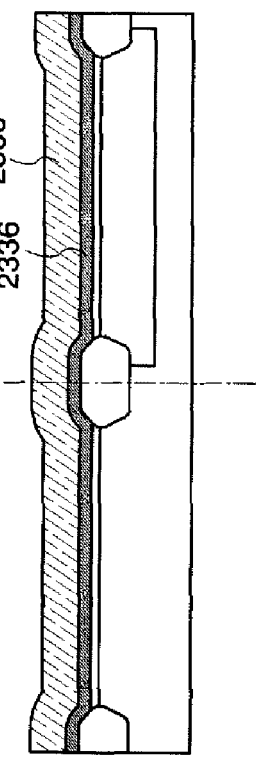

Next, a conductive film is formed so as to cover the insulating films 2332 and 2334 which are formed respectively over the regions 2304 and 2306 provided in the semiconductor substrate 2300 (see FIG. 10C). Here, an example is shown where conductive films 2336 and 2338 are sequentially stacked as the conductive film. Needless to say, the conductive film may be formed to have a single layer or a stacked structure of three or more layers.

As a material of the conductive films 2336 and 2338, an element selected from tantalum (Ta), tungsten (W), titanium (Ti), molybdenum (Mo), aluminum (Al), copper (Cu), chromium (Cr), niobium (Nb), and the like, or an alloy material or a compound material containing the element as its main component can be used. Alternatively, a metal nitride film obtained by nitridation of the element can also be used. Furthermore, a semiconductor material typified by polycrystalline silicon doped with an impurity element such as phosphorus can also be used.

Here, a stacked structure is employed in which the conductive film 2336 is formed using tantalum nitride and the conductive film 2338 is formed thereover using tungsten. Alternatively, it is also possible to form the conductive film 2336 using a single-layer film or a stacked film of tungsten nitride, molybdenum nitride, and/or titanium nitride and to form the conductive film 2338 using a single-layer film or a stacked film of tantalum, molybdenum, and/or titanium.

Next, the stacked conductive films 2336 and 2338 are removed as selected by etching, so that the conductive films 2336 and 2338 remain above part of the regions 2304 and 2306. Thus, gate electrodes 2340 and 2342 are formed (see FIG. 11A).

Next, a resist mask 2348 is formed as selected so as to cover the region 2304, and the region 2306 is doped with an impurity element using the resist mask 2348 and the gate electrode 2342 as masks, so that impurity regions are formed (see FIG. 11B). As an impurity element, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. Here, phosphorus (P) is used as the impurity element.

In FIG. 1113, by introduction of an impurity element, impurity regions 2352 which form source and drain regions and a channel formation region 2350 are formed in the region 2306.

Next, a resist mask 2366 is formed as selected so as to cover the region 2306, and the region 2304 is doped with an impurity element using the resist mask 2366 and the gate electrode 2340 as masks, so that impurity regions are formed (see FIG. 11C). As an impurity element, an n-type impurity region or a p-type impurity region is used. As an n-type impurity element, phosphorus (P), arsenic (As), or the like can be used. As a p-type impurity element, boron (B), aluminum (Al), gallium (Ga), or the like can be used. Here, an impurity element (e.g., boron (B)) of a conductivity type opposite to that of the impurity element introduced into the region 2306 in FIG. 11B is used. As a result, impurity regions 2370 which form source and drain regions and a channel formation region 2368 are formed in the region 2304.

Next, a second insulating film 2372 is formed so as to cover the insulating films 2332 and 2334 and the gate electrodes 2340 and 2342. Then, wirings 2374, which are electrically connected to the impurity regions 2352 and 2370 formed respectively in the regions 2306 and 2304, are formed over the second insulating film 2372 (see FIG. 12A).

The second insulating film 2372 can be formed of a single layer or a stacked layer of an insulating film containing oxygen or nitrogen, such as silicon oxide, silicon nitride, silicon oxynitride, or silicon nitride oxide; a film containing carbon such as DLC (diamond-like carbon); an organic material such as epoxy, polyimide, polyamide, polyvinyl phenol, benzocyclobutene, or acrylic; or a siloxane material such as a siloxane resin. Note that a siloxane material corresponds to a material having a bond of Si—O—Si. Siloxane has a skeleton structure with the bond of silicon (Si) and oxygen (O). As a substituent, an organic group containing at least hydrogen (e.g., an alkyl group or aromatic hydrocarbon) is used. Alternatively, a fluoro group may be used as the substituent. Further alternatively, a fluoro group and an organic group containing at least hydrogen may be used as the substituent.

The wirings 2374 are formed of a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing the element as its main component. An alloy material containing aluminum as its main component corresponds to, for example, a material which contains aluminum as its main component and also contains nickel, or a material which contains aluminum as its main component and also contains nickel and one or both of carbon and silicon. For example, the wirings 2374 are preferably formed to have a stacked structure of a barrier film, an aluminum-silicon (Al—Si) film, and a barrier film or a stacked structure of a barrier film, an aluminum silicon (Al—Si) film, a titanium nitride film, and a barrier film. Note that the "barrier film" corresponds to a thin film formed of titanium, titanium nitride, molybdenum, or molybdenum nitride. Aluminum and aluminum silicon are the most suitable material for forming the wirings 2374 because they have a low resistance value and are inexpensive. In addition, if barrier layers are provided as the top layer and the bottom layer, generation of hillocks of aluminum or aluminum silicon can be prevented. When a barrier film formed of titanium which is an element having a high reducing property is formed, even when there is a thin natural oxide film formed on the crystalline semiconductor film, the natural oxide film can be chemically reduced, and a favorable contact between the wirings 2374 and the crystalline semiconductor film can be obtained.

Note that the structure of the transistor of the present invention is not limited to the one shown in the drawings. For example, a transistor with an inversely staggered structure, a FinFET structure, or the like can be used. A FinFET structure is preferable because it can suppress a short channel effect which occurs with reduction in transistor size.

In this embodiment mode, a secondary battery is stacked over the wiring 2374 connected to the transistor. The secondary battery has a structure in which a current-collecting thin film, a negative electrode active material layer, a solid electrolyte layer, a positive electrode active material layer, and a current-collecting thin film are sequentially stacked (see FIG. 12B). Therefore, it is necessary that a material of the wiring 2374 that is also a material of the current-collecting thin film of the secondary battery has high adhesion to a negative electrode active material and also has low resistance. In particular, aluminum, copper, nickel, vanadium, or the like is preferably used.

Subsequently, the structure of the thin-film secondary battery is described in detail. A negative electrode active material layer 2391 is formed over the wiring 2374. In general, vanadium oxide ($V_2O_5$) or the like is used. Next, a solid electrolyte layer 2392 is formed over the negative electrode active material layer 2391. In general, lithium phosphate ($Li_3PO_4$) or the like is used. Next, a positive electrode active material layer 2393 is formed over the solid electrolyte layer 2392. In general, lithium manganate ($LiMn_2O_4$) or the like is used. Lithium cobaltate ($LiCoO_2$) or lithium nickel oxide ($LiNiO_2$) can also be used. Next, a current-collecting thin film 2394 to serve as an electrode is formed over the positive electrode active material layer 2393. It is necessary that the current-collecting thin film 2394 has high adhesion to the positive electrode active material layer 2393 and also has low resistance. For example, aluminum, copper, nickel, vanadium, or the like can be used.

Each of the above-described thin layers of the negative electrode active material layer 2391, the solid electrolyte layer 2392, the positive electrode active material layer 2393, and the current-collecting thin film 2394 may be formed by a sputtering technique or an evaporation technique. In addition, the thickness of each layer is preferably 0.1 to 3 μm.

Next, an interlayer film 2396 is formed by application of a resin. The interlayer film 2396 is etched to form a contact hole. The interlayer film 2396 is not limited to a resin, and other films such as a CVD oxide film may also be used; however, a resin is preferably used in terms of flatness. Alternatively, the contact hole may be formed using a photosensitive resin without using etching. Next, a wiring layer 2395 is formed over the interlayer film 2396 and is connected to the wiring 2397, so that an electrical connection between the secondary battery and the transistor is secured.

With the above-described structure, the semiconductor device of the present invention can have a structure in which transistors are formed using a single crystal substrate and a thin-film secondary battery is formed thereover. Thus, reduction in thickness and size of the semiconductor device of the present invention can be achieved.

Note that the manufacturing method of the semiconductor device of this embodiment mode can be applied to the semiconductor devices of other embodiment modes described in this specification.

Embodiment Mode 7

In this embodiment mode, applications of an RFID tag that is an example of a usage pattern of a semiconductor device provided with the semiconductor memory device described in the above embodiment modes and is capable of wirelessly transmitting and receiving information will be described. The RFID tag can be used as a so-called ID label, ID tag, or ID card, which is provided in, for example, bills, coins, securities, bearer bonds, documents (such as driver's licenses or resident's cards), packaging containers (such as wrapping paper or bottles), storage media (such as DVD software or video tapes), vehicles (such as bicycles), personal belongings (such as bags or glasses), foods, plants, animals, clothing, everyday articles, tags on goods such as electronic appliances or on packs. The electronic appliance refers to a liquid crystal display device, an EL display device, a television set (also simply referred to as a TV set, a TV receiver, or a television receiver), a mobile phone, or the like. Hereinafter, applications of the present invention and an example of a product to which the semiconductor device of the present invention is attached are described with reference to FIGS. 513A to 13E.

Figure 13A:
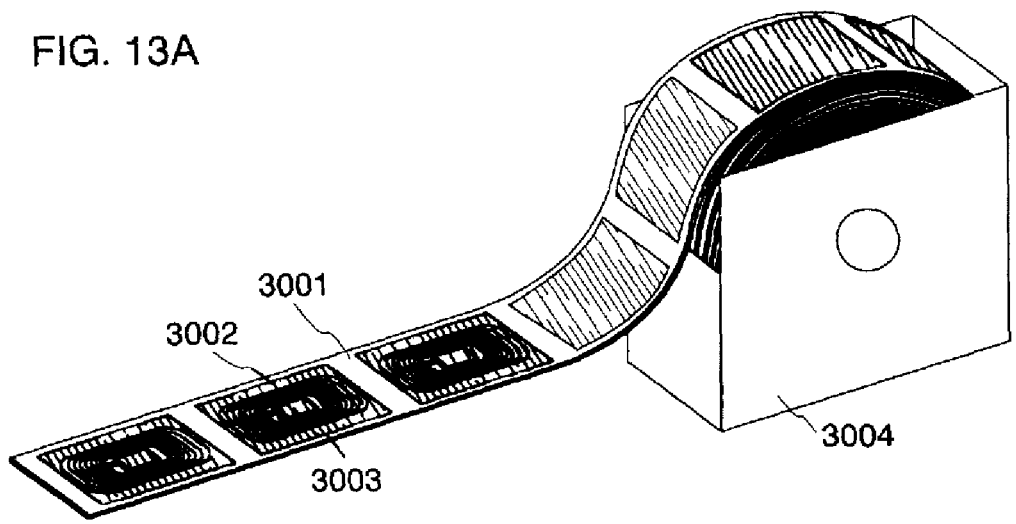
FIGS. 13A to 13E are diagrams each showing an example of a usage pattern of a semiconductor device of the present invention.

FIG. 13A shows examples of completed products including semiconductor devices of the present invention. A plurality of ID labels 3003 each including a semiconductor device 3002 are formed on a label board (separate paper) 3001. The ID labels 3003 are stored in a box 3004. In addition, on the ID label 3003, information on a product or a service (a name of the product, a brand, a trademark, a trademark owner, a seller, a manufacturer, or the like) is written, while an ID number that is unique to the product (or the type of the product) is assigned to the included semiconductor device to make it possible to easily detect forgery, infringement of intellectual property rights such as patent rights and trademark rights, and illegality such as unfair competition. In addition, a large amount of information that cannot be clearly written on a container of the product or the label (for example, the production area, selling area, quality, raw material, efficacy, use, quantity, shape, price, production method, usage, time of the production, time of use, expiration date, instructions for the product, information about the intellectual property of the product, or the like) can be inputted to the semiconductor device so that a client or a consumer can access the information with the use of a simple reader. Moreover, the semiconductor device is structured so that the producer of a product can easily rewrite or erase information, but a client or a consumer cannot. Note that a structure in which a display portion is provided for a semiconductor device to display such information may be employed.

Figure 13B:
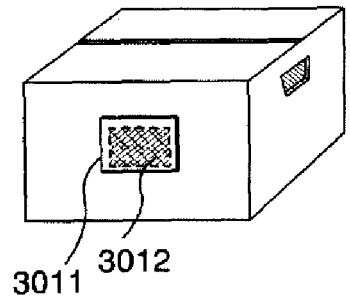

FIG. 13B shows a label-shaped semiconductor device 3011 including a semiconductor device 3012. Providing a product with the semiconductor device 3011 makes it easy to manage the product. For example, in a case where a product is stolen, the product can be traced, so the criminal can be identified quickly. Thus, providing the semiconductor device makes it possible to distribute products that are superior in so-called traceability.

Figure 13C:
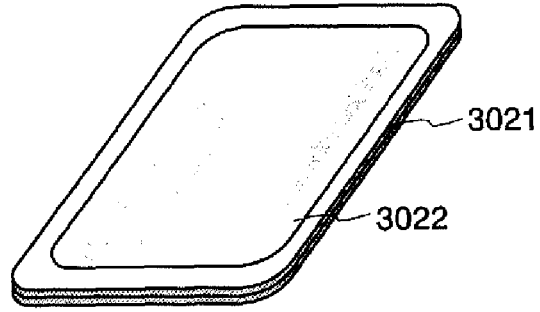

FIG. 13C shows an example of a completed product of an IC card 3021 with a built-in semiconductor device 3022. As the IC card 3021, various kinds of cards can be used, such as cash cards, credit cards, prepaid cards, electronic tickets, electronic money, telephone cards, and membership cards. In addition, a structure may be employed in which a display portion is provided on a surface of the ID card 3021 to display various information.

Figure 13D:
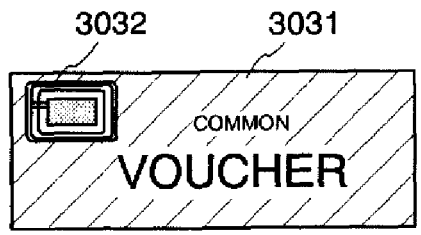

FIG. 13D shows a completed product of a bearer bond 3031. The bearer bond 3031 is embedded with a semiconductor device 3032, and the periphery of the semiconductor device 3032 is covered with a resin, so that the semiconductor device is protected. Here, a filler is dispersed in the resin. The bearer bond 3031 can be formed in the same way as the semiconductor device of the present invention. Note that the bearer bonds include stamps, tickets, admission tickets, merchandise coupons, book coupons, stationery coupons, beer coupons, rice coupons, various gift coupons, various service coupons, and the like. However, needless to say, application of the present invention is not limited to these. In addition, when the semiconductor device 3032 of the present invention is provided in bills, coins, securities, bearer bonds, certificates, or the like, an authentication function can be provided. With the authentication function, forgery can be prevented.

Figure 13E:
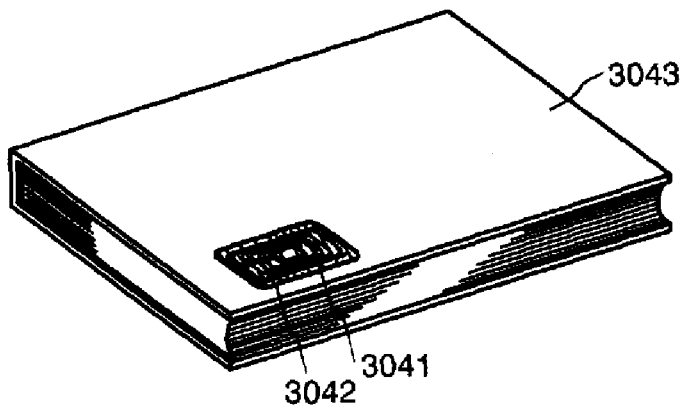

FIG. 13E shows a book 3043 to which an ID label 3041 including a semiconductor device 3042 of the present invention is attached. The semiconductor device 3042 of the present invention is firmly attached in or on goods by being attached to a surface or embedded therein. As shown in FIG. 513E, the semiconductor device 3042 is firmly attached to goods in such a manner that the semiconductor device 3042 is embedded in paper of a book, or embedded in an organic resin of a package. Since the semiconductor device 3042 of the present invention can be small, thin, and lightweight, it can be firmly attached to or in goods without spoiling their design.

In addition, although not illustrated here, the efficiency of a system such as an inspection system can be improved by provision of the semiconductor device of the present invention in packaging containers, storage media, personal belongings, foods, clothing, everyday articles, electronic appliances, or the like. In addition, providing the semiconductor device on or in a vehicle makes it possible to prevent counterfeit and theft. When the semiconductor device is implanted into creatures such as animals, individual creatures can be easily identified. For example, implanting the semiconductor device in creatures such as domestic animals makes it possible to easily identify their year of birth, sex, breed, or the like.

Figure 14A:
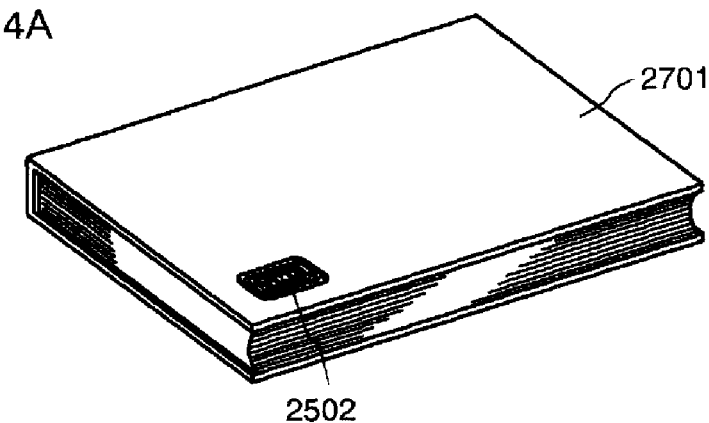
FIGS. 14A to 14D are diagrams each showing an example of a usage pattern of a semiconductor device of the present invention.
Figure 14B:
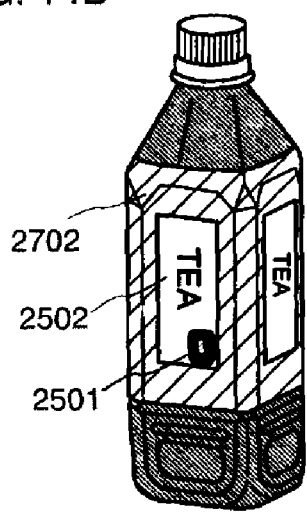

FIGS. 14A and 14B show a book 2701 and a plastic bottle 2702 to which the ID label 2502 including a semiconductor device 2501 of the present invention. Since the semiconductor device used in the present invention is extremely thin, a function and design are not spoiled even when an article such as the book is equipped with the ID label 2502. In addition, in a case of a wireless thin film integrated circuit device, an antenna and a chip can be formed over the same substrate and the wireless thin film integrated circuit device can be directly transferred to a product having a curved surface easily.

Figure 14C:
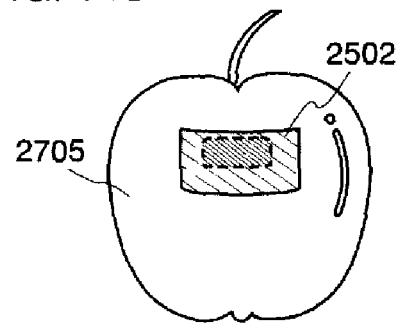
Figure 14D:
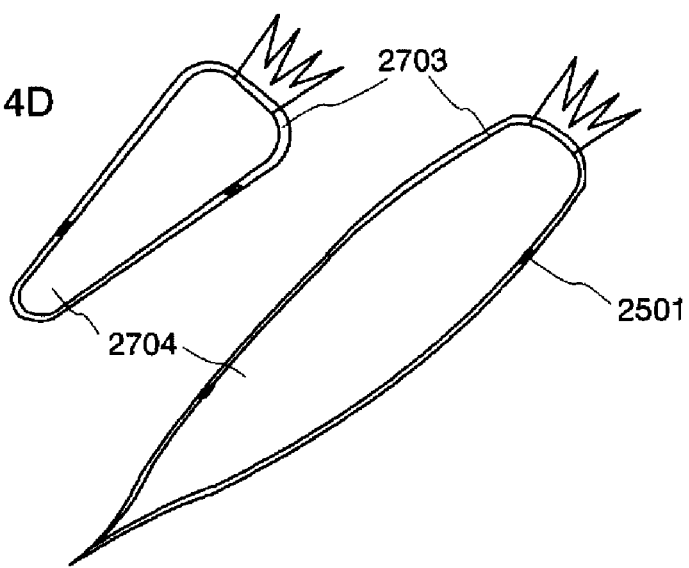

FIG. 14C shows a condition in which the ID label 2502 including the semiconductor device 2501 is directly attached to fruit 2705 or the like which is a fresh food. In addition, FIG. 14D shows an example in which vegetables 2704 or the like are wrapped with the packaging film or the like. Note that in a case of attaching the semiconductor device 2501 to a product, the semiconductor device 2501 might be taken off. However, in a case of wrapping a product with a packaging film 2703 or the like, it is difficult to take off the packaging film 2703 or the like; thus, some advantages of anticrime measures are obtained. Note that the semiconductor device of the present invention can be used for any of products in addition to the above-described products.

Note that the structure of the semiconductor memory device described in this embodiment mode can be freely combined with any of structures described in other embodiment modes in this specification.

What is claimed is:

1. A semiconductor memory device comprising:
    an SRAM cell including a first transistor, a second transistor, a first CMOS circuit and a second CMOS circuit, wherein the first CMOS circuit includes a third transistor and a fourth transistor, and wherein the second CMOS circuit includes a fifth transistor and a sixth transistor;
    a decoder connected to the SRAM cell through a word line;
    a read/write circuit connected to the SRAM cell through a first data line and a second data line; and a power storage unit connected to the SRAM cell a source or a drain of the sixth transistor, wherein the power storage unit stores up an electric power supplied from the first data line or the second data line through the SRAM cell.

2. The semiconductor memory device according to claim 1, wherein the power storage unit is charged when data is written to or read from the SRAM cell.

3. The semiconductor memory device according to claim 1, wherein the semiconductor memory device comprises a plurality of the SRAM cells, and the power storage unit is provided for each of the plurality of the SRAM cells.

4. The semiconductor memory device according to claim 1, wherein the power storage unit is a capacitor.

5. The semiconductor memory device according to claim 1, wherein the power storage unit is a secondary battery.

6. A semiconductor device comprising:

an antenna circuit;

a decoder and a read/write circuit which are driven by an electric power supplied through the antenna circuit;

an SRAM cell that is connected to the decoder through a word line and connected to the read/write circuit through a first data line and a second data line, wherein the SRAM cell includes a first transistor, a second transistor, a first CMOS circuit and a second CMOS circuit, wherein the first CMOS circuit includes a third transistor and a fourth transistor, and wherein the second CMOS circuit includes a fifth transistor and a sixth transistor; and a power storage unit that is connected to a source or a drain of the sixth transistor, wherein the power storage unit stores up an electric power supplied from the first data line or the second data line through the SRAM cell.

7. The semiconductor device according to claim 6, wherein the SRAM cell operates even in a case where a power supply voltage is not supplied to the decoder and to the read/write circuit through the antenna circuit.

8. The semiconductor device according to claim 6, wherein the power storage unit is a capacitor.

9. The semiconductor device according to claim 6, wherein the power storage unit is a secondary battery.

10. A semiconductor device comprising:

an antenna circuit;

a power supply portion rectifying an electric power supplied through the antenna circuit and outputting a rectified electric power;

a decoder and a read/write circuit which are driven by an electric power supplied through the antenna circuit;

an SRAM cell connected to the decoder through a word line and connected to the read/write circuit through a first data line and a second data line, wherein the SRAM cell includes a first transistor, a second transistor, a first CMOS circuit and a second CMOS circuit, wherein the first CMOS circuit includes a third transistor and a fourth transistor, and wherein the second CMOS circuit includes a fifth transistor and a sixth transistor; and a power storage unit connected to a source or a drain of the sixth transistor, wherein the power storage unit stores up an electric power supplied from the power supply portion or an electric power supplied from the first data line or the second data line through the SRAM cell.

11. The semiconductor device according to claim 10, wherein the power storage unit and the power supply portion are connected to each other through a diode element.

12. The semiconductor device according to claim 10, wherein the SRAM cell operates even in a case where a power supply voltage is not supplied to the decoder and to the read/write circuit through the antenna circuit.

13. The semiconductor device according to claim 10, wherein the power storage unit is a capacitor.

14. The semiconductor device according to claim 10, wherein the power storage unit is a secondary battery.

* * * * *